(12) United States Patent
Siau

(10) Patent No.: US 10,585,603 B2
(45) Date of Patent: *Mar. 10, 2020

(54) ARRAY VOLTAGE REGULATING TECHNIQUE TO ENABLE DATA OPERATIONS ON LARGE MEMORY ARRAYS WITH RESISTIVE MEMORY ELEMENTS

(71) Applicant: UNITY SEMICONDUCTOR CORPORATION, Sunnyvale, CA (US)

(72) Inventor: Chang Hua Siau, Saratoga, CA (US)

(73) Assignee: Unity Semiconductor Corporation, Sunnyvale, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/018,837

(22) Filed: Jun. 26, 2018

(65) Prior Publication Data
US 2018/0364931 A1 Dec. 20, 2018

Related U.S. Application Data

(63) Continuation of application No. 15/631,130, filed on Jun. 23, 2017, now Pat. No. 10,031,686, which is a
(Continued)

(51) Int. Cl.
*G11C 11/00* (2006.01)
*G06F 3/06* (2006.01)
(Continued)

(52) U.S. Cl.
CPC ............ *G06F 3/0625* (2013.01); *G06F 3/061* (2013.01); *G06F 3/0655* (2013.01);
(Continued)

(58) Field of Classification Search
CPC ............ G11C 13/003; G11C 5/06; G11C 8/08; G11C 2213/72
See application file for complete search history.

(56) References Cited

U.S. PATENT DOCUMENTS 4,727,519 A 2/1988 Morton et al.
5,483,482 A 1/1996 Yamada et al.
(Continued)

OTHER PUBLICATIONS

Abelmann et al., "Self-Assembled Three-Dimensional Non-Volatile Memories," Micromachines 2010, vol. 1, pp. 1-18, Jan. 18, 2010. 18 pages.
(Continued)

*Primary Examiner* — Uyen B Tran
(74) *Attorney, Agent, or Firm* — Lowenstein Sandler LLP

(57) ABSTRACT

Embodiments of the invention relate generally to semiconductors and memory technology, and more particularly, to systems, integrated circuits, and methods to preserve states of memory elements in association with data operations using variable access signal magnitudes for other memory elements, such as implemented in third dimensional memory technology. In some embodiments, a memory device can include a cross-point array with resistive memory elements. An access signal generator can modify a magnitude of a signal to generate a modified magnitude for the signal to access a resistive memory element associated with a word line and a subset of bit lines. A tracking signal generator is configured to track the modified magnitude of the signal and to apply a tracking signal to other resistive memory elements associated with other subsets of bit lines, the tracking signal having a magnitude at a differential amount from the modified magnitude of the signal.

20 Claims, 11 Drawing Sheets

Related U.S. Application Data continuation of application No. 15/213,756, filed on Jul. 19, 2016, now Pat. No. 9,720,611, which is a continuation of application No. 14/568,025, filed on Dec. 11, 2014, now Pat. No. 9,401,202, which is a continuation of application No. 14/024,946, filed on Sep. 12, 2013, now Pat. No. 8,929,126, which is a continuation of application No. 13/134,589, filed on Jun. 10, 2011, now Pat. No. 8,559,209.

(51) Int. Cl.
*G11C 8/08* (2006.01)
*G11C 11/419* (2006.01)
*G11C 13/00* (2006.01)
*G11C 5/06* (2006.01)

(52) U.S. Cl.
CPC .............. *G06F 3/0688* (2013.01); *G11C 5/06* (2013.01); *G11C 8/08* (2013.01); *G11C 11/419* (2013.01); *G11C 13/0002* (2013.01); *G11C 13/003* (2013.01); *G11C 13/0004* (2013.01); *G11C 13/0007* (2013.01); *G11C 13/0011* (2013.01); *G11C 13/0021* (2013.01); *G11C 13/0023* (2013.01); *G11C 13/0038* (2013.01); *G11C 13/0069* (2013.01); *G11C 13/0097* (2013.01); *G11C 2213/72* (2013.01)

(56) References Cited

U.S. PATENT DOCUMENTS

| | | | |
|---|---|---|---|
| 5,553,276 A | 9/1996 | Dean | |
| 5,831,909 A * | 11/1998 | Shirley | G11C 7/14 365/189.07 |
| 5,991,193 A | 11/1999 | Gallagher et al. | |
| 6,034,882 A | 3/2000 | Johnson et al. | |
| 6,128,214 A | 10/2000 | Kuekes et al. | |
| 6,185,122 B1 | 2/2001 | Johnson et al. | |
| 6,204,139 B1 | 3/2001 | Liu et al. | |
| 6,351,406 B1 | 2/2002 | Johnson et al. | |
| 6,385,074 B1 | 5/2002 | Johnson et al. | |
| 6,407,953 B1 | 6/2002 | Cleeves | |
| 6,420,215 B1 | 7/2002 | Knall et al. | |
| 6,459,095 B1 | 10/2002 | Heath et al. | |
| 6,473,332 B1 | 10/2002 | Ignatiev et al. | |
| 6,504,753 B1 | 1/2003 | Scheuerlein et al. | |
| 6,515,888 B2 | 2/2003 | Johnson et al. | |
| 6,515,904 B2 | 2/2003 | Moore et al. | |
| 6,522,594 B1 | 2/2003 | Scheuerlein | |
| 6,525,953 B1 | 2/2003 | Johnson | |
| 6,534,403 B2 | 3/2003 | Cleeves | |
| 6,545,891 B1 | 4/2003 | Tringali et al. | |
| 6,569,745 B2 | 5/2003 | Hsu | |
| 6,599,796 B2 | 7/2003 | Mei et al. | |
| 6,631,085 B2 | 10/2003 | Kleveland et al. | |
| 6,642,539 B2 | 11/2003 | Ramest et al. | |
| 6,693,821 B2 | 2/2004 | Hsu et al. | |
| 6,759,249 B2 | 7/2004 | Zhuang et al. | |
| 6,777,248 B1 | 8/2004 | Nabatame et al. | |
| 6,816,410 B2 | 11/2004 | Kleveland et al. | |
| 6,822,903 B2 | 11/2004 | Scheuerlein et al. | |
| 6,836,421 B2 | 12/2004 | Rinerson et al. | |
| 6,850,455 B2 | 2/2005 | Rinerson et al. | |
| 6,859,382 B2 | 2/2005 | Rinerson et al. | |
| 6,870,751 B2 | 3/2005 | Van Brocklin et al. | |
| 6,882,553 B2 | 4/2005 | Nejad et al. | |
| 6,917,539 B2 | 7/2005 | Rinerson et al. | |
| 6,927,430 B2 | 8/2005 | Hsu | |
| 6,937,505 B2 | 8/2005 | Morikawa | |
| 6,940,113 B2 | 9/2005 | Hsu et al. | |
| 6,940,744 B2 | 9/2005 | Rinerson et al. | |
| 6,970,375 B2 | 11/2005 | Rinerson et al. | |
| 7,001,846 B2 | 2/2006 | Hsu | |
| 7,009,909 B2 | 3/2006 | Rinerson et al. | |
| 7,020,006 B2 | 3/2006 | Chevallier et al. | |
| 7,022,572 B2 | 4/2006 | Scheuerlein et al. | |
| 7,023,743 B2 | 4/2006 | Nejad et al. | |
| 7,046,550 B1 | 5/2006 | Reohr et al. | |
| 7,057,914 B2 | 6/2006 | Rinerson et al. | |
| 7,079,442 B2 | 7/2006 | Rinerson et al. | |
| 7,141,481 B2 | 11/2006 | Hsu et al. | |
| 7,177,181 B1 | 2/2007 | Scheuerlein | |
| 7,256,415 B2 | 8/2007 | Furukawa et al. | |
| 7,339,811 B2 | 3/2008 | Nejad et al. | |
| 7,372,753 B1 | 5/2008 | Rinerson et al. | |
| 7,379,364 B2 | 5/2008 | Siau et al. | |
| 7,394,680 B2 | 7/2008 | Toda et al. | |
| 7,405,960 B2 | 7/2008 | Cho et al. | |
| 7,411,811 B2 | 8/2008 | Inoue | |
| 7,417,271 B2 | 8/2008 | Genrikh et al. | |
| 7,443,711 B1 | 10/2008 | Stewart et al. | |
| 7,463,546 B2 | 12/2008 | Fasoli et al. | |
| 7,498,600 B2 | 3/2009 | Cho et al. | |
| 7,505,344 B2 | 3/2009 | Scheuerlein | |
| 7,508,695 B2 | 3/2009 | Sugita | |
| 7,608,467 B2 | 10/2009 | Wu et al. | |
| 7,639,521 B2 | 12/2009 | Baek et al. | |
| 7,643,344 B2 | 1/2010 | Choi | |
| 7,701,791 B2 | 4/2010 | Rinerson et al. | |
| 7,706,177 B2 | 4/2010 | Petti | |
| 7,719,876 B2 | 5/2010 | Chevallier et al. | |
| 7,733,685 B2 | 6/2010 | Scheuerlein et al. | |
| 7,742,323 B2 | 6/2010 | Rinerson et al. | |
| 7,782,650 B2 | 8/2010 | Bertin et al. | |
| 7,842,991 B2 | 11/2010 | Cho et al. | |
| 7,884,349 B2 | 2/2011 | Rinerson et al. | |
| 7,898,841 B2 | 3/2011 | Chevallier et al. | |
| 7,902,867 B2 | 3/2011 | Mouttet | |
| 7,902,868 B2 | 3/2011 | Norman | |
| 7,955,871 B2 | 6/2011 | Wu et al. | |
| 7,983,065 B2 | 7/2011 | Samachisa | |
| 8,139,409 B2 | 3/2012 | Chevallier et al. | |
| 8,363,443 B2 | 1/2013 | Chevallier et al. | |
| 2001/0055838 A1 | 12/2001 | Walker et al. | |
| 2003/0003675 A1 | 1/2003 | Hsu | |
| 2004/0109353 A1 | 6/2004 | Matsuoka | |
| 2004/0170040 A1 | 9/2004 | Rinerson et al. | |
| 2005/0269626 A1 | 12/2005 | Forbes | |
| 2006/0131695 A1 | 6/2006 | Kuekes et al. | |
| 2006/0171200 A1 | 8/2006 | Rinerson et al. | |
| 2008/0068875 A1 | 3/2008 | Choi | |
| 2008/0090401 A1 | 4/2008 | Bratkovski et al. | |
| 2008/0157127 A1 | 7/2008 | Bertin et al. | |
| 2008/0278989 A1 | 11/2008 | Lee et al. | |
| 2009/0027976 A1 | 1/2009 | Brewer et al. | |
| 2009/0154232 A1 | 6/2009 | Norman | |
| 2009/0302315 A1 | 12/2009 | Lee et al. | |
| 2009/0316465 A1 * | 12/2009 | Jain | G11C 7/22 365/94 |
| 2010/0044666 A1 | 2/2010 | Baek et al. | |
| 2010/0067279 A1 | 3/2010 | Choi | |
| 2010/0073990 A1 | 3/2010 | Siau et al. | |
| 2010/0078759 A1 | 4/2010 | Sekar et al. | |
| 2010/0103724 A1 | 4/2010 | Kim et al. | |
| 2010/0110771 A1 | 5/2010 | Choi | |
| 2010/0134239 A1 | 6/2010 | Wu et al. | |
| 2010/0155686 A1 | 6/2010 | Bratkovski et al. | |
| 2010/0155722 A1 | 6/2010 | Meyer | |
| 2010/0157658 A1 | 6/2010 | Schloss et al. | |
| 2010/0159641 A1 | 6/2010 | Rinerson et al. | |
| 2010/0159688 A1 | 6/2010 | Rinerson et al. | |
| 2010/0161888 A1 | 6/2010 | Eggleston | |
| 2010/0195393 A1 | 8/2010 | Eggleston | |
| 2010/0202188 A1 | 8/2010 | Rinerson et al. | |
| 2010/0271885 A1 | 10/2010 | Scheuerlein et al. | |
| 2010/0278479 A1 | 11/2010 | Bratkovski et al. | |
| 2010/0290294 A1 | 11/2010 | Siau | |
| 2011/0006275 A1 | 1/2011 | Roelofs et al. | |
| 2011/0017977 A1 | 1/2011 | Bratkovski et al. | |
| 2011/0024710 A1 | 2/2011 | Bratkovski et al. | |
| 2011/0024716 A1 | 2/2011 | Bratkovski et al. | |
| 2011/0059576 A1 | 3/2011 | Cho et al. | |
| 2011/0085399 A1 | 4/2011 | Chen et al. | |

(56) References Cited

U.S. PATENT DOCUMENTS

| | | |
|---|---|---|
| 2011/0188281 A1 | 8/2011 | Siau et al. |
| 2011/0188282 A1 | 8/2011 | Chevallier et al. |
| 2011/0188283 A1 | 8/2011 | Chevallier et al. |
| 2011/0188284 A1 | 8/2011 | Chevallier et al. |
| 2011/0297927 A1 | 12/2011 | Ramaswamy et al. |
| 2012/0012897 A1 | 1/2012 | Besser et al. |
| 2012/0314468 A1 | 12/2012 | Siau et al. |
| 2013/0043455 A1 | 2/2013 | Bateman |
| 2013/0082228 A1 | 4/2013 | Parrillo et al. |
| 2013/0082232 A1 | 4/2013 | Wu et al. |

OTHER PUBLICATIONS

Baek et al., "Realization of Vertical Resistive Memory (VRRAM) Using Cost Effective 3D Process," IDEM 2011, 31 8.1, pp. 737-740. 4 pages.

Bateman, Bruce, U.S. Appl. No. 13/210,292 filed Aug. 15, 2011, re Filed Application with Figures. 88 pages.

Chevallier et al., "A 0.13um 64Mb Multi-Layered Conductive Metal-Oxide Memory," ISSCC 2010/ Session 14/ Non-Volatile Memory/ 14.3, pp. 260-261. 2 pages.

Dong et al., "Si/a-Si Core/Shell Nanowires as Nonvolatile Crossbar Switches," Nano Letters 2008, vol. 8, No. 2, pp. 861-391. 6 pages.

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193. 2 pages.

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137. 2 pages.

Kim et al., "Novel Vertical-Stacked-Array-Transistor (VSAT) for Ultra-High-Density and Cost-Effective NAND Flash Memory Devices and SSD (Solid State Drive)," 2009 Symposium on VLSI Technology Digest of Technical Papers, pp. 186-187. 2 pages.

Kim et al., "Multi-Layered Vertical Gate NAND Flash Overcoming Stacking Limit for Terabit Density Storage," 2009 VLSI Symposium on VLSI Technology Digest of Technical Papers, Jun. 16-18, 2009, pp. 188-189. 2 pages.

Krieger, Ju H., "Principle Operation of 3-D Memory Device based on Piezoacousto Properties of Ferroelectric Films," InTech, Dec. 2010, pp. 3-16. 14 pages.

Kwong et al., "Vertical Silicon Nanowire Platform for Low Power Electronics and Clean Energy Applications," May 25, 2011, Journal of Nanotechnology, vol. 2012, Article ID 492121. 21 pages.

Lue et al., "A Highly Scalable 8-Layer 3D Vertical-Gate (VG) TFT NAND Flash Using Junction-Free Buried Channel BE-SONOS Device," 2010 Symposium on VLSI Technology, Jun. 15-17, 2010, pp. 131-132. 2 pages.

Ou et al., "Array Architecture for a Nonvolatile 3-Dimensional Cross-Point Memory," Doctoral Dissertation, Stanford University, Mar. 2010, pp. 1-119. 119 pages.

Ou et al., "Array Architecture for a Nonvolatile 3-Dimensional Cross-Point Resistance-Change Memory," IEEE Journal of Solid-State Circuits, vol. 46, No. 9, Sep. 2011, pp. 2158-2170. 13 pages.

Parrillo, Louis, U.S. Appl. No. 13/250,772, filed Sep. 30, 2011, re Filed Application with Figures. 63 pages.

Siau, Chang, U.S. Appl. No. 13/134,579, filed Jun. 10, 2011, re Filed Application with Figures. 64 pages.

Strachan et al., "The switching location of a bipolar memristor: chemical, thermal and structural mapping," Nanotechnology 22 (2011) 254015, pp. 1-6. 7 pages.

Wu, Jian, U.S. Appl. No. 13/250,923, filed Sep. 30, 2011, re Filed Application with Figures. 44 pages.

Yoon et al., "Vertical Cross-point Resistance Change Memory for Ultra-High Density Non-volatile Memory Applications," 2009 Symposium on VLSI Technology Digest of Technical Papers, pp. 26-27. 2 pages.

Zhang et al., "A 3D RRAM Using Stackable 1TXR Memory Cell for High Density Application," IEEE Xplore, Feb. 5, 2010, pp. 917-920. 4 pages.

* cited by examiner

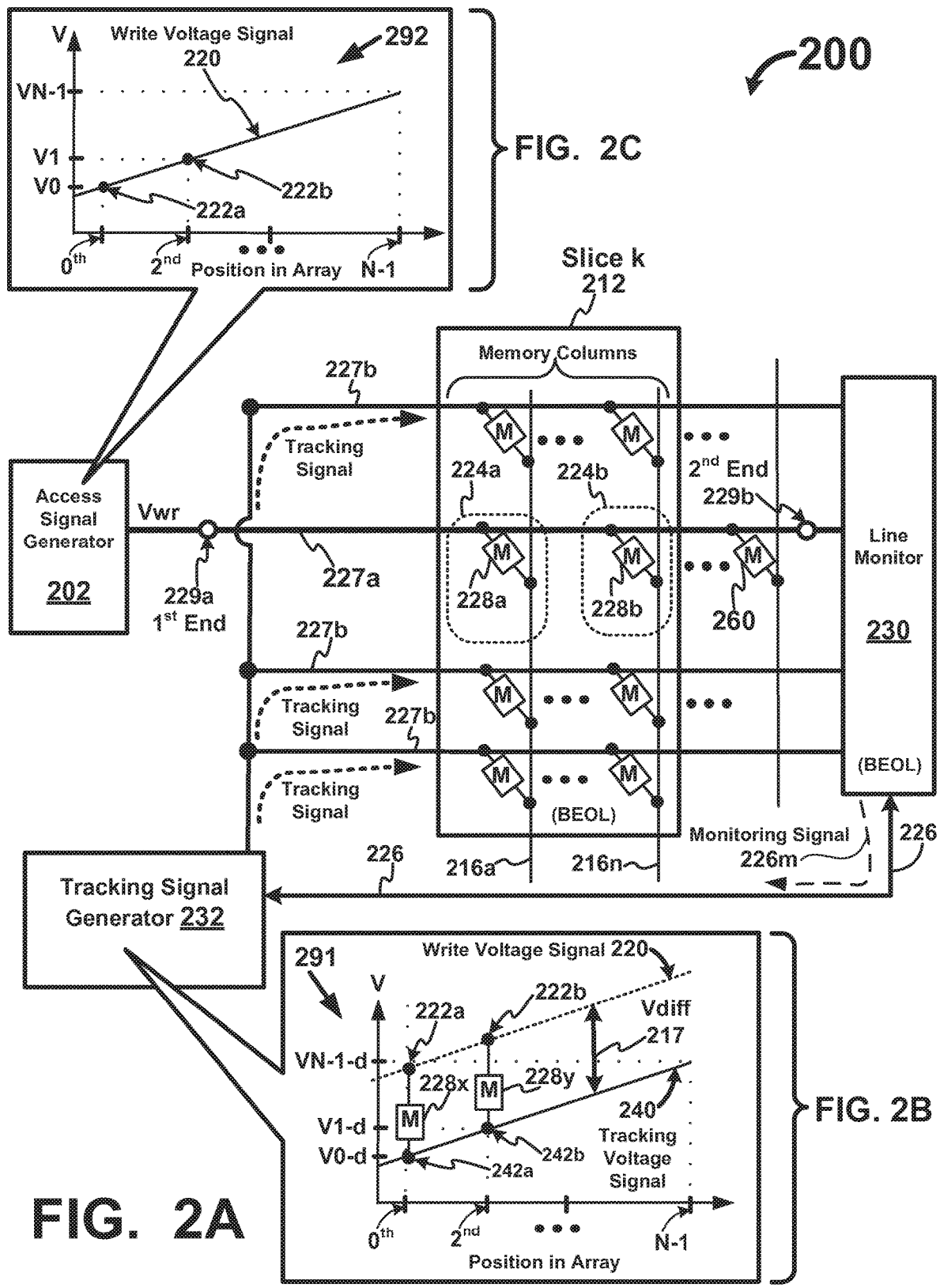

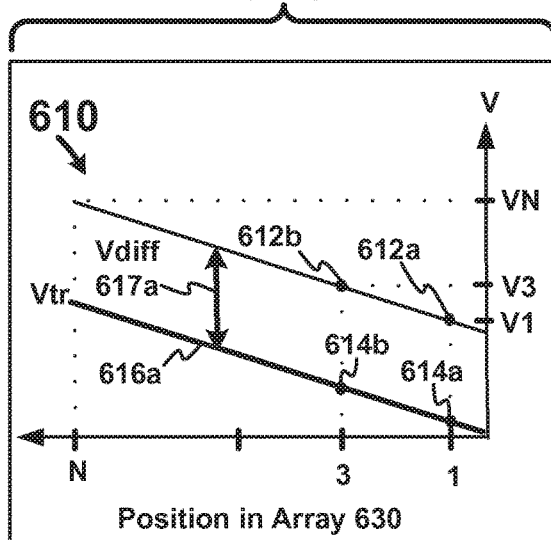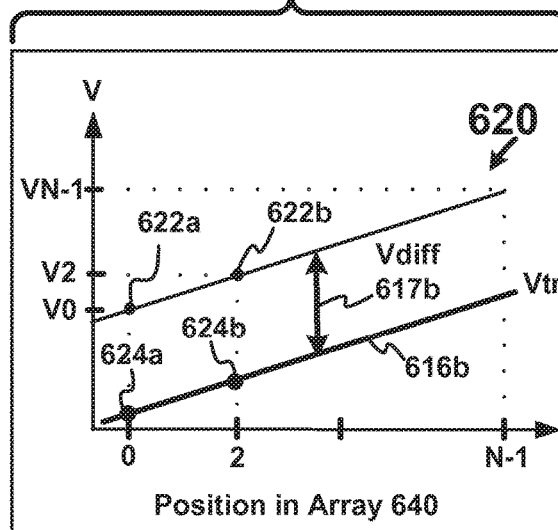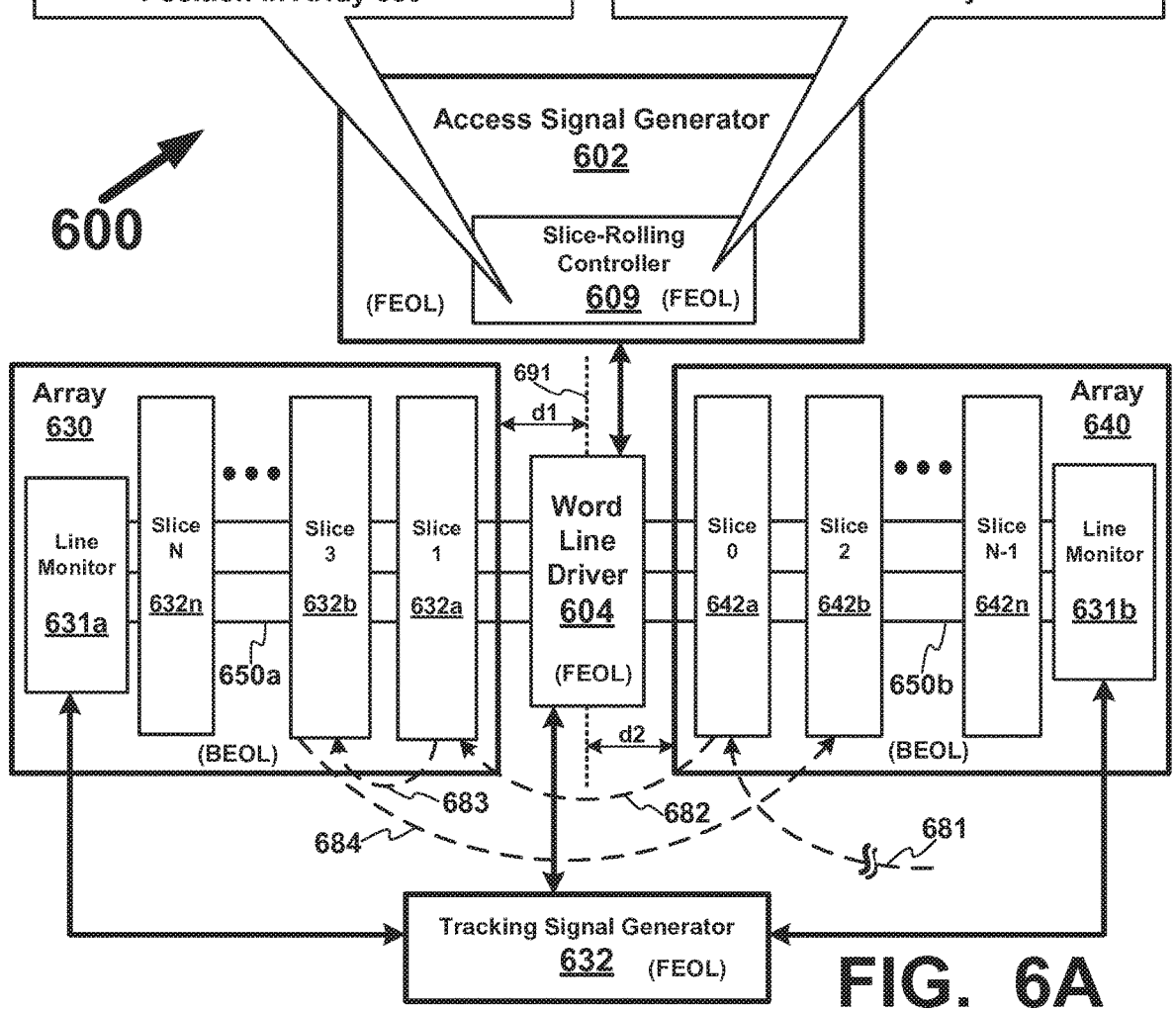
FIG. 6A

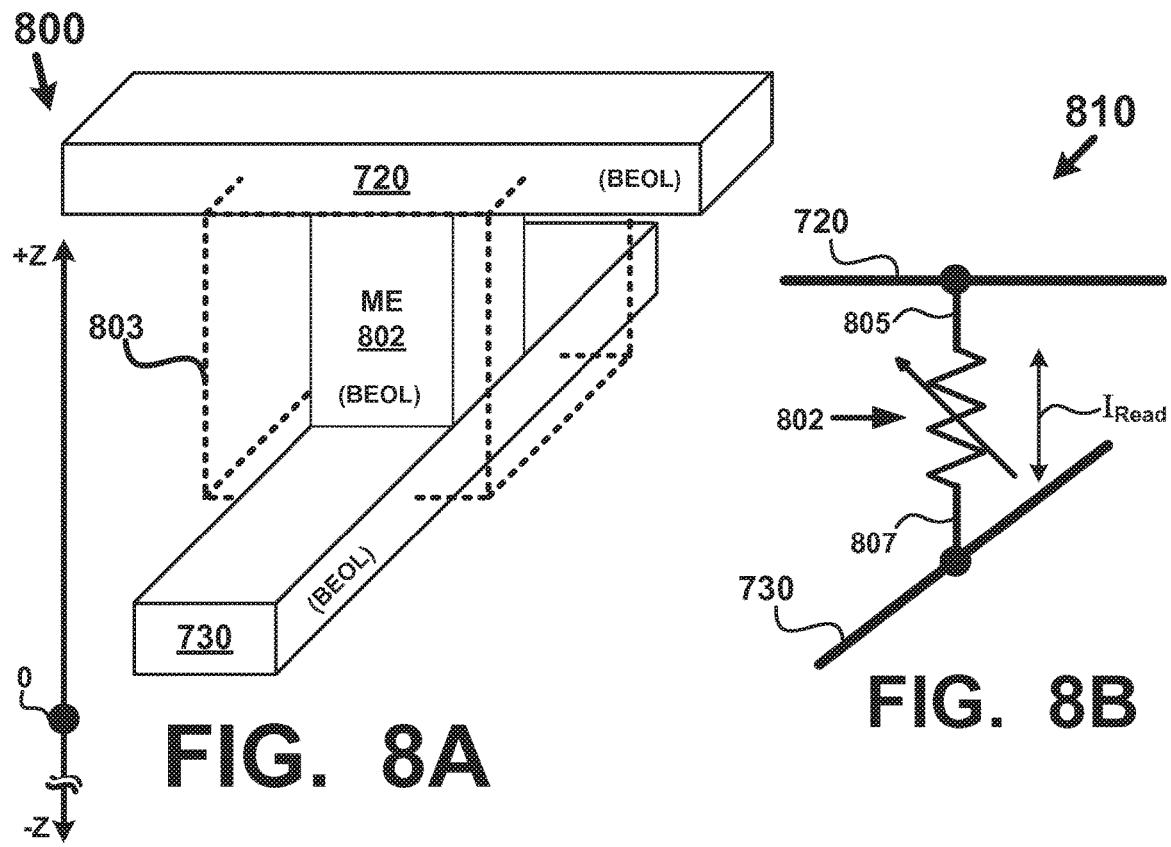
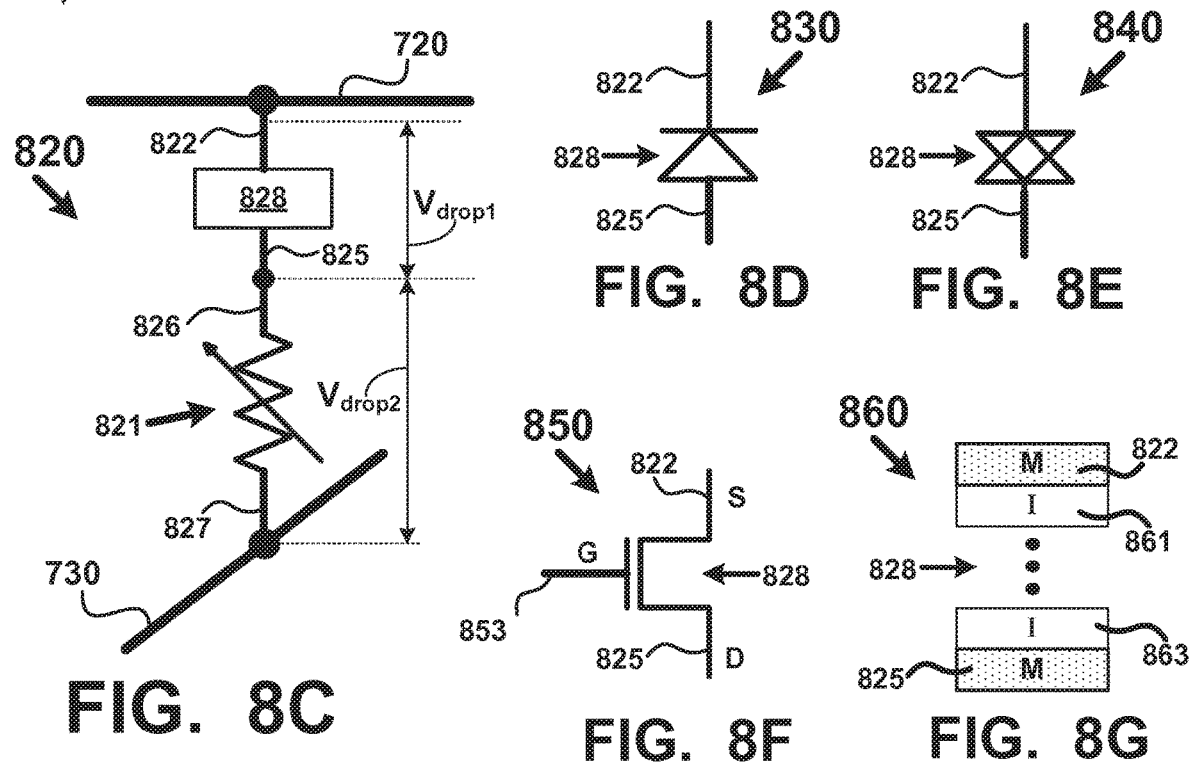

ARRAY VOLTAGE REGULATING TECHNIQUE TO ENABLE DATA OPERATIONS ON LARGE MEMORY ARRAYS WITH RESISTIVE MEMORY ELEMENTS

RELATED APPLICATIONS

This application is a continuation of U.S. application Ser. No. 15/631,130, filed Jun. 23, 2017, which is a continuation of U.S. Ser. No. 15/213,756, filed Jul. 19, 2016, now U.S. Pat. No. 9,720,611, which is a continuation of U.S. application Ser. No. 14/568,025, filed Dec. 11, 2014, now U.S. Pat. No. 9,401,202, which is a continuation of U.S. application Ser. No. 14/024,946, filed Sep. 12, 2013, now U.S. Pat. No. 8,929,126, which is a continuation of U.S. application Ser. No. 13/134,589, filed Jun. 10, 2011, now U.S. Pat. No. 8,559,209, all of which are incorporated herein in their entirety.

CROSS-REFERENCE TO RELATED APPLICATIONS

This application is related to: U.S. patent application Ser. No. 11/095,026, filed Mar. 30, 2005, and published as U.S. Pub. No. 2006/0171200, and entitled "Memory Using Mixed Valence Conductive Oxides,"; U.S. patent application Ser. No. 11/881,500, filed Sep. 11, 2008, now U.S. Pat. No. 7,801,791, and entitled "Low Read Current Architecture for Memory"; U.S. patent application Ser. No. 12/657,895, filed Jan. 29, 2010, and entitled "Access Signal Adjustment Circuits and Methods for Memory Cells in a Cross-Point Array,"; U.S. patent application Ser. No. 12/653,836, filed Dec. 18, 2009, and published as U.S. Pub. No. 2010/0157658, and entitled "Conductive Metal Oxide Structures In Non-Volatile Re-Writable Memory Devices"; U.S. patent application Ser. No. 11/881,496, filed Jul. 26, 2007, now U.S. Pat. No. 7,897,951, and entitled "Continuous Plane Of Thin-Film Materials For A Two-Terminal Cross-Point Memory"; and U.S. patent application Ser. No. 12/653,851, filed Dec. 18, 2009, and published as U.S. Pub. No. 2010/0159641, and entitled "Memory Cell Formation Using Ion Implant Isolated Conductive Metal Oxide", all of which are incorporated herein by reference in their entirety for all purposes.

TECHNICAL FIELD

The present invention relates generally to non-volatile memory for integrated circuits, ASIC's and systems that utilize non-volatile RAM storage and more particularly to non-volatile memory including access circuitry configured to regulate voltages for data operations based on memory element position on a conductive array line.

BACKGROUND

Scaling the dimensions of memory arrays and cells affect operational characteristics of memory technologies. In some memory technologies, a reduction in size of word lines or bit lines can increase the resistivity of those lines as the cross-sectional area of conductive paths is reduced also. The increased resistance of word lines or bit lines may produce a reduction of voltage (e.g., voltage drops) along those lines, for example, as a function of the amount of current conducted by memory cells to/from the word lines or bit lines in response to voltages for data operations being applied to the word lines and/or bit lines.

At least some conventional memory architectures, such as those including dynamic random access memory ("DRAM") cells and Flash memory cells, typically include gates as part of metal oxide semiconductor ("MOS") transistors or structures. The gates operate to open and close conductive paths between the word lines or bit lines and portions of the memory cells used as storage. When one of the conventional memory cells is un-selected, its gate is in an "off" mode of operation and conducts negligible to no current. The gate structures used in conventional memory architectures buffer the conventional memory cells from the effects of increased resistance of word lines or bit lines (e.g., high current densities that can damage array lines). The above-described memory architectures, while functional for their specific technologies, are not well suited to address the scaling down of memory array and cell dimensions to smaller geometries (e.g., sub 45 nm dimensions) for other memory technologies. Further, the use of gate-like structures (e.g., a select device or non-ohmic device—NOD) to govern the flow of current in conventional memory architectures and memory cells facilitate data retention of un-selected memory cells during memory cell access operations to selected memory cells, and, thus, are not well-suited to operate memory cells other than those operating with gate-like structures including but not limited to 1T1R, 1D1R, 2T1R, and 2D1R memory cells, for example.

There are continuing efforts to provide improved systems, integrated circuits, and methods that minimize one or more of the drawbacks associated with conventional techniques for facilitating data operations in scaled memory arrays and cells, including but not limited to discrete two-terminal re-writeable non-volatile memory elements disposed in one or more two-terminal memory arrays.

BRIEF DESCRIPTION OF THE DRAWINGS

The invention and its various embodiments are more fully appreciated in connection with the following detailed description taken in conjunction with the accompanying drawings, in which:

FIG. 1C depicts one example of a memory element in accordance with various embodiments;

FIG. 2A depicts an example of a tracking signal generator applying tracking signals to a slice in accordance with various embodiments;

FIG. 2B depicts an example of a tracking voltage signal having a magnitude that tracks or follows a magnitude of write voltage signal by a differential amount in accordance with various embodiments;

FIG. 2C depicts an example of a write voltage signal having a modified magnitude based on various positions on an access line in accordance with various embodiments;

FIG. 4B depicts an example of a wave form for a transitioning signal generated during a write operation to a slice in accordance with various embodiments;

FIG. 5B depicts an example of a diagram of a target signal tracking an access signal, such as a write signal magnitude, according to at least some embodiments;

FIG. 5C depicts an example of a transitioning signal applied to a subset of bit lines associated with a position 0 in accordance with various embodiments;

FIG. 5D depicts an example of transitioning signal applied to a word line to transition a memory element associated with a position 1 into a writeable state in accordance with various embodiments;

FIG. 6A depicts a tracking signal generator implemented with an access signal generator that includes a slice-rolling controller, according to various embodiments;

FIG. 6B depicts one example of modified voltage magnitudes generated by a slice-rolling controller based on a position of a memory element in an array, according to various embodiments;

FIG. 6C depicts one example of modified voltage magnitudes generated by a slice-rolling controller based on a position of a memory element in another array, according to various embodiments;

FIG. 7B depicts one example of an array that can be embedded in a single layer or multiple layers of memory and also depicts an example of how an array can be partitioned (e.g., subdivided) into a plurality of slices, according to various embodiments;

FIG. 7C depicts an example of a single layer of memory in which one or more of the arrays in FIG. 7B can be embedded, according to various embodiments;

FIG. 7D depicts an example of multiple layers of memory in which each layer can include one or more of the arrays in FIG. 7B embedded therein, according to various embodiments;

FIG. 7E depicts an example of a FEOL substrate that includes a logic layer having access circuitry electrically coupled with one or more of the BEOL arrays in FIG. 7B, according to various embodiments;

FIG. 7F depicts an example a monolithically integrated die for an integrated circuit comprised of the FEOL logic layer of FIG. 7E and the BEOL memory layer(s) of FIG. 7C or FIG. 7D, according to various embodiments; and FIG. 7G depicts one example of a discrete two-terminal re-writeable non-volatile memory element that can be positioned between a cross-point of the array of FIG. 7B, according to various embodiments;

FIG. 8A depicts a profile view of a memory cell that includes a discrete two-terminal memory element positioned between a cross-point of two conductive array lines of a two-terminal cross-point array, according to various embodiments;

FIG. 8B depicts a schematic representation of the memory element of FIG. 8A, according to various embodiments;

FIG. 8C depicts a schematic representation of a memory cell that includes a selection device electrically in series with a memory element, according to various embodiments;

FIG. 8D depicts a single diode as an example of a selection device, according to various embodiments;

FIG. 8E depicts a pair of back-to-back diodes as an example of a selection device, according to various embodiments;

FIG. 8F depicts a transistor as one an example of a selection device, according to various embodiments;

FIG. 8G depicts a cross-sectional view of a metal-insulator-metal device as example of a selection device, according to various embodiments;

Figures 1A, 1B:
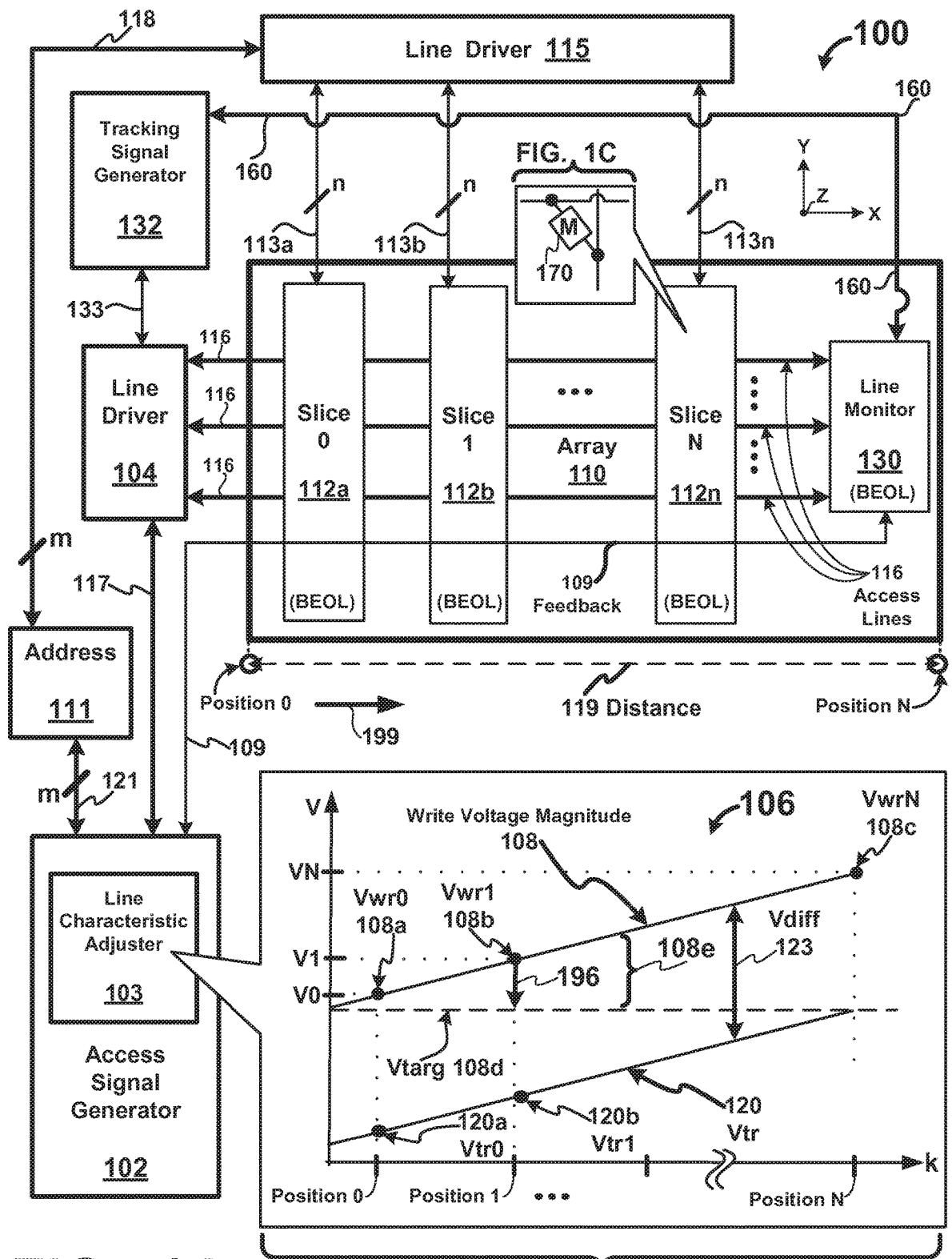
FIG. 1A depicts an example of a tracking signal generator in accordance with various embodiments.
FIG. 1B depicts an example of a relationship between a position on an access line and modification of a magnitude of an access voltage based on the position in accordance with various embodiments.

Like reference numerals refer to corresponding parts throughout the several views of the drawings. Note that most of the reference numerals include one or two left-most digits that generally identify the figure that first introduces that reference number. The depictions in the various drawing figures are not necessarily to scale.

DETAILED DESCRIPTION

Various embodiments or examples of the invention may be implemented in numerous ways, including as a system, a process, an apparatus, or a series of program instructions on a computer readable medium such as a computer readable storage medium or a computer network where the program instructions are sent over optical, electronic, or wireless communication links. In general, operations of disclosed processes may be performed in an arbitrary order, unless otherwise provided in the claims.

A detailed description of one or more examples is provided below along with accompanying figures. The detailed description is provided in connection with such examples, but is not limited to any particular example. The scope is limited only by the claims, and numerous alternatives, modifications, and equivalents are encompassed. Numerous specific details are set forth in the following description in order to provide a thorough understanding. These details are provided as examples and the described techniques may be practiced according to the claims without some or all of the accompanying details. For clarity, technical material that is known in the technical fields related to the examples has not been described in detail to avoid unnecessarily obscuring the description.

U.S. patent application Ser. No. 11/095,026, filed Mar. 30, 2005, published as U.S. Pub. No. 2006/0171200, and entitled "Memory Using Mixed Valence Conductive Oxides," is hereby incorporated by reference in its entirety for all purposes and describes non-volatile third dimensional memory elements that may be arranged in a two-terminal, cross-point memory array. New memory structures are possible with the capability of this third dimensional memory array. In at least some embodiments, a two-terminal memory element or memory cell can be configured to change conductivity when exposed to an appropriate voltage drop across the two-terminals. The memory element can include an electrolytic tunnel barrier and a mixed valence conductive oxide in some embodiments, as well as multiple mixed valence conductive oxide structures in other embodiments. A voltage drop across the electrolytic tunnel barrier can cause an electrical field within the mixed valence conductive oxide that is strong enough to move oxygen ions in a mixed valence conductive oxide, according to some embodiments.

In some embodiments, an electrolytic tunnel barrier and one or more mixed valence conductive oxide structures (e.g., one or more layers of a conductive metal oxide material) do not need to operate in a silicon substrate, and, therefore, can be fabricated above circuitry being used for other purposes. That is, the active circuitry portion can be fabricated front-end-of-the-line (FEOL) on a substrate (e.g., a Silicon—Si die or wafer or other semiconductor substrate) and one or more layers of two-terminal cross-point memory arrays that include the non-volatile memory elements can be fabricated back-end-of-the-line (BEOL) directly on top of the substrate and electrically coupled with the active circuitry in the FEOL layer using an inter-level interconnect structure that can be fabricated FEOL, BEOL, or a combination of FEOL and BEOL. The actual configuration of the inter-level interconnect structure will be application dependent and may depend on a pitch of an uppermost metal layer of the FEOL layer and a pitch of the array lines in the BEOL layer. Further, a discrete re-writeable non-volatile two-terminal memory element can be positioned between a cross-point of two conductive array lines such that one terminal is directly electrically coupled with an X-direction line (e.g., an "X-line" or "word line") and the other terminal is directly electrically coupled with a Y-direction line (e.g., a "Y-line" or "bit line"), such that the two-terminal memory element is electrically in series with its respective X and Y direction lines. Data stored in the discrete two-terminal memory element is retained in the absence of electrical power such that the memory element is non-volatile. A third dimensional memory can include multiple memory elements vertically stacked upon one another, sometimes sharing X-direction and Y-direction lines in a layer of memory, and sometimes having isolated lines. When a first write voltage, VW1, is applied across the memory element (e.g., by applying ½ VW1 to the X-direction line and ½-VW1 to the Y-direction line), the memory element can switch to a low resistive state. When a second write voltage, VW2, is applied across the memory element (e.g., by applying ½ VW2 to the X-direction line and ½-VW2 to the Y-direction line), the memory element can switch to a high resistive state. Memory elements using electrolytic tunnel barriers and mixed valence conductive oxides can have VW1 opposite in polarity from VW2.

FIG. 1A illustrates a tracking signal generator in accordance with various embodiments. In diagram 100, a tracking signal generator 132 is electrically coupled via a number of access lines 116 to memory cells in an array 110. An example of array 110 is a two-terminal cross-point array. In some embodiments, array 110 can be subdivided (e.g., partitioned) into slices 112, such as slice ("0") 112a, slice ("1") 112b, through slice ("N") 112n, each slice representing a group of memory cells and optionally a group of indicator cells as will be described in greater detail below. Although tracking signal generator 132 is depicted in electrical communication 133 with line driver 104 to access lines 116, the tracking signal generator 132 can be configure to electrically communicate with other circuitry (not shown) to access the lines 116, according to some embodiments. Tracking signal generator 132 is configured to track the value of an access signal, such as a voltage for a data operation (e.g., read, write, erase, and program) on one or more memory cells in array 110. The access signal is applied to a memory cell associated with an access line 116. The tracking signal generator 132 is further configured to apply a tracking signal to other memory cells associated with at least one of the access lines 116. According to various embodiments, a memory cell of array 110 includes a memory element 170, with fewer or more other components. In some embodiments, a memory element ("M") 170 can be a resistive memory element configured to maintain a resistive state representative of a data stored therein. In yet other embodiments, memory element 170 retains the data stored therein in the absence of electrical power such that the data is non-volatile. As used herein, the term "discrete memory element" can refer, at least in some examples, to a structure that includes no more than memory element 170. For example, a discrete memory element can be a gateless two-terminal memory device, that is, a memory device without a selection device. Memory element 170 can, as a discrete memory element, constitute a memory cell, according to at least some embodiments. In some examples, a programmed state is a high resistance state (e.g., a logic "0"), and an erased state is a low resistance state (e.g., a logic "1"), thereby establishing a magnitude of an access current (e.g., a read current) that is relatively lower for the programmed state and is relatively higher for the erased state. A range of resistive states can represent more than two memory states (i.e., a memory element can store two or more data values as a multi-level cell—MLC). FIG. 1C depicts one example of a two-terminal memory element 170 having a first terminal electrically coupled with a first conductive line (e.g., a word line or x-direction array line) and a second terminal electrically coupled with a second conductive line (e.g., a bit line or y-direction array line). Here, two-terminal memory element 170 can be one of a plurality of memory elements 170 (not shown) that are positioned in each slice (0-N). Each slice can include one or more two-terminal cross-point arrays with each array including a plurality of x-direction conductive array lines, a plurality of y-direction conductive array lines, and a plurality of the two-terminal memory elements 170. Hereinafter, conductive array lines will be referred to as array lines. Each two-terminal memory element 170 can be positioned between a cross-point of one of x-direction array lines with one of the y-direction array lines. Further, each two-terminal memory element 170 can be electrically in series with its respective array lines and each memory element can be electrically accessed for a data operation (e.g., read, write, program, erase) by applying a select voltage (e.g., a read voltage or a write voltage) across its respective x and y direction array lines. Typically, the plurality of x-direction array lines and the plurality of y-direction array lines are oriented orthogonally to each another and are disposed in facing relation to each other (e.g., see cross-point array 710 in FIG. 7B). For example, the x-direction array lines can be aligned with a X axis and the y-direction array lines can be aligned with a Y axis, with a Z axis running into and out of the drawing sheet of FIG. 1A. For discrete two-terminal memory elements, the terminals of the memory element are directly electrically coupled with its respective array lines.

Diagram 100 also depicts an access signal generator 102 configured to generate a signal to access one or more memory cells along any access line 116 in any of slices 112a to 112n. Access signal generator 102 modifies a magnitude of an access signal to generate a modified magnitude for accessing a memory element associated with access line 116 and one of the slices 112. The memory element can be the memory element 170 depicted in FIG. 1C or some other type of memory element as will be described in greater detail below. For example, access signal generator 102 can generate an access signal having a first magnitude (e.g., a first write voltage) for one of slices 112 and another access signal having a second magnitude (e.g., a second write voltage) for another one of slices 112. The modified magnitude of the access signal can be a function of a characteristic of access line 116 of a memory cell in array 110, according to some embodiments. In some embodiments, access signal generator 102 includes a line characteristic adjuster 103 configured to determine the magnitude of the access signal as a function of at least one characteristic of access lines 116, such as a distance along one of the access lines 116 (e.g., a distance between the position of a memory cell and access signal generator 102), or some other reference point in array 110 or other circuitry depicted in FIG. 1A. An increasing distance 119 (e.g., in direction of arrow 199) from a position 0 can be representative of an increasing cumulative line resistance as a characteristic of one or more of the access lines 116. Optionally, tracking signal generator 132 can be configured to determine (e.g., modify) the magnitude based on at least one monitoring signal via a feedback path 160 from a line monitor 130, the monitoring signal representing the magnitude of the access signal at a location in array 110.

In view of the foregoing, the structures and/or functionalities of tracking signal generator 132 can provide for sufficient signal magnitudes to reliably access values (e.g., parametric values of resistances, currents, voltages, etc.) representing data value(s) stored in a memory element 170, for example, over various scaled dimensions of access lines 116, memory elements 170, slices 112, and/or array 110. In some cases, the resistance of access lines 116 increases as the dimensions are scaled down (e.g., from 45 nm line widths to 20 nm line widths, or less), which, in turn, amplifies the effects of one or more voltage drops (e.g., an IR drop) developed by one or more other resistive memory elements when accessing a memory element during a memory operation (data operation hereinafter). Access signal generator 102 is configured to adjust the magnitude of the signal (e.g., the access signal) for accessing memory element 170 to compensate for the one or more voltage drops along access line 116. As the modified magnitude of the access signal is applied to a specific memory element 170 (e.g., a memory element 170 selected for a data operation) for a particular data operation, the modified magnitude may also be applied to one or more other resistive memory elements that are not selected (e.g., non-selected or un-selected) for the data operation. Optimally, un-selected memory elements 170 should maintain their resistive states and the data stored therein during such a data operation, such that the resistive value representing the data stored in the un-selected memory element(s) 170 is not disturbed by the data operation to the selected memory element 170. Tracking signal generator 132 is configured to electrically isolate the un-selected memory elements from effects of the modified magnitude, such as an increased voltage difference across the un-selected memory elements, thereby preserving the states of the un-selected memory elements (i.e., reducing or eliminating disturbs to resistive states for those un-selected memory elements 170). Therefore, tracking signal generator 132 can reduce or eliminate inadvertent data operations (e.g., inadvertent writes) to un-selected memory elements. Further, tracking signal generator 132 can generate a tracking signal having a magnitude that reduces or eliminates data operations that cause inadvertent memory accesses. The tracking signal, for example, can be a function of a line resistance (e.g., a distance) along which an access signal (e.g., a write voltage) traverses along access line 116. Thus, the tracking signal for one memory element can have a position-dependent magnitude based on the position or location of another memory element, which is subject to a particular data operation. According to some embodiments, the tracking signal provides for a magnitude at a differential amount (or substantially at a differential amount) from the modified magnitude of the signal. The differential amount can be applied across a first terminal and a second terminal of each un-selected resistive memory element to maintain data stored in that memory element in an un-disturbed state. That is, the resistive value of the stored data prior to the access is not altered as a result of the access. Further, tracking signal generator 132 can apply the tracking signal via access lines 116 other than that used for a data operation (i.e., other access lines 116 or word lines that are not selected for the data operation). In FIG. 1A and in other figures of the Drawings, structure not designated as BEOL can be implemented as active circuitry (e.g., CMOS circuitry fabricated on Silicon—Si) in a FEOL logic layer as will be described in greater detail below in regards to FIGS. 7A and 11.

Attention is now directed to FIG. 1B to illustrate operation of tracking signal generator 132. Consider that access signal generator 102 is configured to cause line driver 104 to generate a write voltage for accessing a selected memory element 170 to write one or more data values to be stored therein, the write voltage being determined (e.g., being adjusted) based on the location of the selected memory element 170 to compensate for one or more voltage drops over one of access lines 116 due to, for example, other memory elements (e.g., un-selected memory elements) and/or the selected memory element. Access signal generator 102 is configured to adjust the magnitude of the signal to compensate for a deviation in the magnitude from a target magnitude (e.g. a value for a target write voltage magnitude, Vtarg) to generate a target write voltage. The target write voltage magnitude Vtarg is then applied to the selected memory element 170 regardless of its position along access line 116. In the example shown, access signal generator 102 is configured to generate write voltage signals to write data into array 110, and the magnitude of the write voltages vary (e.g., increase or decrease) as a function of a position at which a memory element is accessed (e.g., for reading, writing, erasing, or for performing other memory-related operations). The position can be any distance 119 between position 0 and position N on the selected access line 116. For an address 111 (e.g., one or more address bits m), access signal generator 102 can identify one of access lines 116 and the associated memory elements for access during a memory cell access operation, such as a write operation, a program operation, an erase operation, etc. Note that in some embodiments, the terms "position" and "distance" can be used interchangeably. Line characteristic adjuster 103 is configured to determine a magnitude of a write voltage as a function of at least one characteristic of an access line 116 and/or its associated memory elements 170. As depicted in relationship 106 of FIG. 1B, line characteristic adjuster 103 can modify the write voltage generated by line driver 104 to form a modified magnitude ("Vwr0") 108*a* so that at a first memory element, such as in slice 0 112*a*, the write voltage has a magnitude approximated to a target write voltage magnitude ("Vtarg") 108*d*. Optionally, access signal generator 102 can be configured to determine (e.g., modify) the magnitude based on an indicator signal via a feedback path ("feedback") 109 from line monitor 130, the indicator signal (e.g., from an indicator memory element) representing the magnitude of the signal at a location in array 110.

Thus, access signal generator 102 can generate modified magnitude ("Vwr0") 108*a* to compensate for a target differential 108*e* (e.g., due to one or more voltage drops) along an access line 116 to apply the modified magnitude as a target write voltage magnitude Vtarg 108*d* at or near the memory element being accessed. In particular, a line resistance to any position on access line 116 can reduce the modified magnitude of a write voltage magnitude by an amount 196, at which the target write voltage is delivered to the selected memory element. Thus, the term "modified magnitude" is represented by the relationship depicted as write voltage magnitude 108, which can be representative of the voltage applied at or near position "0" of an access line 116. The modified magnitude compensates for voltage drops and delivers a target access voltage (e.g., less amount 196) to a memory element for access (e.g., for writing). Further, line characteristic adjuster 103 can modify the write voltages generated by line driver 104 to form modified magnitudes ("Vwr1") 108*b* and ("VwrN") 108*c* for application to one of access lines 116 so that the write voltages have magnitudes approximated to a target write voltage magnitude Vtarg 108*d* at or near a second memory element disposed in slice 1 112*b* and a third memory element disposed in slice N 112*n*, respectively. Thus, modified magnitude 108*b* is generated for a memory element in slice 1 112*b*, and modified magnitude 108*c* is generated for a memory element in slice 112*n*. In some embodiments, access signal generator 102 and line driver 104 cooperate to apply different modified magnitudes of an access signal to write or read memory elements in different slices. For example, as access signal generator 102 generates modified magnitudes 108*a*, 108*b*, and 108*c* for an access signal, the access signal can cause data to be written into slices 112*a*, 112*b*, and 112*n*, respectively. Note that line driver 104 and line driver 115 can individually or collectively determine (e.g., adjust) a write voltage (e.g., a program voltage or an erase voltage), or a read voltage, to compensate for the one or more voltage drops, according to some embodiments.

Further to FIG. 1A, tracking signal generator 132 is configured to track the value of an access signal depicted as having a write voltage magnitude 108 relative to a line characteristic, such as position. As shown generally, tracking signal generator 132 generates a magnitude 120 that tracks write voltage magnitude 108 of the signal by a differential amount ("Vdiff") 123. In particular, tracking signal generator 132 is configured to determine modified magnitudes ("Vwr0") 108*a* and ("Vwr1") 108*b*, and is further configured to generate magnitudes of the tracking signal as tracking signal voltages ("Vtr0") 120*a* and ("Vtr1") 120*b*, respectively. In some embodiments, tracking signal generator 132 is configured to detect modified magnitudes 108*a* and 108*b* in collaboration with line monitor 130, and, in response, generate a tracking signal having magnitudes 120*a* and 120*b*, respectively. Line monitor 130 monitors an access line 116 and the modification of the write voltage magnitude 108 thereon, and conveys via path 160 a monitoring signal to tracking signal generator 132, which, in turn, generates the tracking signal voltages 120*a* and 120*b*. The monitoring signal is representative of the modified magnitude applied at a particular location on an access line 116 as the write voltage magnitude 108.

In some embodiments, a memory element 170 can be referred to as a "gateless" memory element (e.g., a discrete memory element) and/or an access line 116 can be referred to as a gateless array line, as such memory cells and array lines of a two-terminal cross-point array may omit gate-like or rectifying mechanisms, such as a diode, a pair of back-to-back diodes, a non-ohmic device, a MIM or MIIM type of non-ohmic device, one or more transistors, or a MOSFET(s), for example, that otherwise operate as open circuits or switches to electrically decouple the memory element from one or both of its respective conductive array lines. Hereinafter, those devices will be collectively denoted as a selection device. Discrete memory element 170 can be selected by activating a line extending from line driver 115 to activate or otherwise access a memory element at the intersection of the line from line driver 115 and one of access lines 116. In some embodiments, line driver 115 is configured as a Y-line driver and/or decoder to drive Y-lines (e.g., arranged in columns or bit lines) in a two-terminal cross-point array, whereas line driver 104 is configured as an X-line driver and/or decoder to drive X-lines (e.g., arranged in rows lines or word lines, such as access lines 116). For example, line driver 115 can drive one or more bit lines 113*a* through 113*n* (collectively referred to as bit lines 113) to select one or more memory elements positioned at the intersection (e.g., a cross-point) of one of the word lines 116 with the one of the bit lines 113. Each slice can include one or more bit lines 113 (denoted as n) that are electrically coupled with the line driver 115. Note that in various embodiments, access signal generator 102 can be implemented in either X-lines or Y-lines, or both. Further, access signal generator 102 can be configured to generate modified magnitudes for access signals that are used to program (e.g., writing one state) or erase (e.g., writing another state) memory element 170, and, as such, can generate modified magnitudes as modified programming voltage magnitudes and/or modified erase voltage magnitudes. As used herein, write or write operation can be used interchangeably with the word program or program operation, respectively. Similarly, write or write operation can be used interchangeably with the word erase or erase operation, respectively. That is, program and erase are types of write operations to one or more memory elements. Generally, read, write, program, and erase are types of access operations on one or more arrays 110 and their respective memory elements or memory cells. In a specific implementation, a slice can include any number n of Y-lines or bit lines 113*a*-113*n*.

For example, a slice can include 256 to 2,048 Y-lines, or more and each slice can include 128 word lines 116. The actual number of word and bit lines in each slice will be application dependent and the above are only examples and each slice can include more or fewer word and bit lines than described herein. Further, the memory layer or layers described herein can be configured to include one or more tiles, with each tile including a predetermined number of slices. The number of word and bit lines in a slice, the number of slices in a tile, and the number of tiles will be application specific and can be determined by several factors including but not limited to a resistivity of the conductive array lines, a read current specification for the memory elements, line widths for the BEOL conductive array lines, a current density specification for the conductive array lines and/or the memory elements, the magnitude of read and/or write voltages, latency times for data operations, the number of memory layers to be implemented, page and/or block size for data operations, just to name a few. For example, for a ~30 nA read current specification for the memory elements, there can be 256 bit lines (113) per slice and 128 word lines (116) per slice and 16 slices per unit array tile. As another example, for a ~6 nA read current specification for the memory elements, there can be 1024 bit lines per slice, 128 word lines per slice, and 4 slices per unit array tile. The number of word lines per slice need not be set at 128 and some other number of word lines per slice can be selected depending on the application. For example, there can be 4096 bit lines and 128 word lines per slice plus an additional number of dummy word lines per slice (e.g., a set of 4 dummy word lines positioned on each side of the 128 word lines). Moreover, there can also be additional bit lines in each slice for purposes of error correction (ECC) (e.g., 256 bit lines for ECC) and bit lines (e.g., 32 bit lines or 128 bit lines) for memory elements used for non-data storage functions such as reference memory elements, indicator memory elements and tracking memory elements, or combinations of those functions, for example. In some embodiments, the structures and/or functionalities (or portions thereof) can be implemented in line driver 104 or line driver 115. In some examples, tracking signal generator 132 generates a particular tracking signal magnitude for sub-groupings of memory elements in a slice (e.g., 16 Y-lines at a time).

In various embodiments, the term "access signal" can refer to any type of signal (e.g., a voltage signal, a current signal, or any other signal) for accessing one or more memory elements in a data operation, such as a read operation, a write operation, a program operation, or an erase operation. In some embodiments, the term "modified magnitude" refers to a magnitude for a signal that has been adapted to, for example, achieve the application of a target access signal magnitude at a particular memory element. As such, the modified magnitude can compensate for a loss of the signal magnitude (e.g., a voltage drop). The term "target access signal magnitude" can refer to a desired magnitude at a particular memory element for effectively performing a certain data operation. Examples of a "target access signal magnitude" include a write signal magnitude, such as a target write voltage (e.g., Vtarg in FIG. 1B), a read signal magnitude, such as a target read voltage, an erase signal magnitude, such as a target erase signal voltage, a program signal magnitude, such as a target program signal voltage, among other memory access-related signals. The term "tracking signal" can refer to any type of signal (e.g., a voltage signal, a current signal, or any other signal) that tracks the characteristics of the memory array and facilitates establishing a potential difference across one or more memory elements that are not selected for a data operation. The potential difference can be a range of voltages or a maximum difference of potentials between the two terminals of the un-selected memory elements. Examples of access lines 116 and bit lines 113 include conductive array lines, having line widths which can be scaled from about 100 nm to about 10 nm, or less. Actual line widths for the conductive array lines will be application dependent.

FIG. 2A illustrates a tracking signal generator applying tracking signals to a slice in accordance with various embodiments. Diagram 200 depicts an access signal generator 202 electrically coupled via a first end 229a of a word line 227a to a slice ("k") 212, which includes a number of bit lines (e.g., "memory columns") 216a to 216n. Also shown is a tracking signal generator 232 configured to generate one or more tracking signals, which are applied to slice k 212 via word lines 227b. Note, the tracking signals are applied to word lines 227b and not to the word line 227a. A line monitor 230 is electrically coupled with word line 227a and word lines 227b, and is configured to detect and/or sample the modified magnitude of the write voltage signal applied to word line 227a. In the example shown, line monitor 230 samples the write voltage signal at a position on word line 227a that is at or adjacent to the second end 229b of word line 227a. Second end 229b can be disposed on word line 227a opposite to first end 229a and separated from the first end 229a by some distance (e.g., distance 119 FIG. 1A). Line monitor 230 generates at least one monitoring signal 226m and electrically communicates the monitoring signal 226m via path 226 to tracking signal generator 232.

Further to FIG. 2A, in FIG. 2C, the access signal generator 202 is configured to generate a write voltage signal 220 as a function of a line characteristic, such as the position at which a memory element is disposed (e.g., its position on word line 227a relative to the first end 229a and/or second end 229b). For example, access signal generator 202 is configured to generate write voltage signal 220 having a modified magnitude of 222a for a memory element at or adjacent to a $0^{th}$ position on word line 227a, and a modified magnitude of 222b for a memory element at or adjacent to a $2^{nd}$ position on word line 227a as depicted in diagram 292 of FIG. 2C. Tracking signal generator 232 is configure to generate a tracking voltage signal 240 that can have a magnitude that tracks or follows a magnitude of write voltage signal 220 by a differential amount ("Vdiff") 217 as depicted in diagram 291 of FIG. 2B. Differential amount 217 can represent a range of voltages that tracking voltage signal 240 deviates from write voltage signal 220. By doing so, differential amount 217 maintains or places un-selected memory elements in a non-accessible state (e.g., a non-writeable state), according to some embodiments.

To illustrate operation of tracking signal generator 232, in FIG. 2B consider that on word line 227a, memory cells 224a and 224b include memory elements 228a and 228b, respectively, that are subject to a write voltage applied to word line 227a. As shown, memory elements 228a and 228b can include discrete memory elements each having no more than two terminals that are directly electrically coupled with their respective word and bit lines (e.g., word line 227a and bit lines 216a and 216n in FIG. 2A). In a scenario in which other memory elements on word line 227a that are positioned between slice k 212 and the second end 229b are selected for a data operation, memory elements 228a and 228b are not selected for the data operation (e.g., a write operation). When memory element 260 on word line 227a is selected to have a writeable state (e.g., is the selected memory element to be written to), memory elements 228a and 228b on word line 227a are not selected to have a writeable state. Although a write voltage signal is applied via word line 227a to one of the terminals of memory elements 228a and 228b, one or more tracking signals are applied to the other terminals of memory elements 228a and 228b to preserve the states of memory elements 228a and 228b in non-writeable states, particularly as write voltage signal 220 (see FIG. 2B) has a magnitude that is modified (e.g., the magnitude of the write voltage 220 increases) for accessing memory element 260 disposed at increased distances along word line 227a. Line monitor 230 detects increases (or decreases) in the magnitude of write voltage signal 220, and transmits the monitoring signal 226m representative of the magnitude of write voltage signal 220. In turn, tracking signal generator 232 modifies the magnitude of the tracking signal to track write voltage signal 220. For example, in FIG.

2B, at the $0^{th}$ position, a modified magnitude 222a is applied via word line 227a to one terminal of memory element 228x and a first magnitude 242a of tracking signal 240 is applied to the other terminal. Memory element 228x remains in a non-accessible state (e.g., non-writeable state) with differential amount 217 being applied across memory element 228x. Next, consider that another memory element 260 is being written at a position farther than the $2^{nd}$ position. Further, memory element 228y is not selected. Access signal generator 202 increases the magnitude of write voltage signal 220 to modified magnitude 222b. Responsive to the increase and/or to the particular value of modified magnitude 222b applied via word line 227a and to a first terminal of memory element 228y, tracking signal generator 232 applies a second magnitude 242b to the other terminal, thereby establishing differential amount 217 and preserving a non-accessible state for memory element 228y. Ideally, the differential amount 217 is a small as possible (e.g., less than about 1.0V). For example, during a write operation, a magnitude of the differential amount 217 can be in a range from about 0V to about' of the half-select voltage for a program or erase operation. Therefore, if the magnitude of the program and/or erase voltage during a write operation is about 3.0V, then a magnitude of the differential amount 217 can be in a range from about 0V to about 1.5V, for example. On the other hand, during a read operation, a magnitude of the differential amount 217 can be in a range from about 0V to about ½ of the half-select voltage for a read operation. Therefore, if the magnitude of the read voltage is about 1.0V, then a magnitude of the differential amount 217 can be in a range from about 0V to about 0.5V, or if the read voltage is about 1.5V, then a magnitude of the differential amount 217 can be in a range from about 0V to about 0.75V, for example. Actual values for differential amount 217 will be application specific and are not limited to the read and write voltage examples described herein. Moreover, as line width dimensions and area of memory elements shrink (i.e., are scaled down), the magnitudes of the read and write voltages can also be scaled down with a resulting reduction in the differential amount 217 at those scaled down dimensions.

Figure 3:
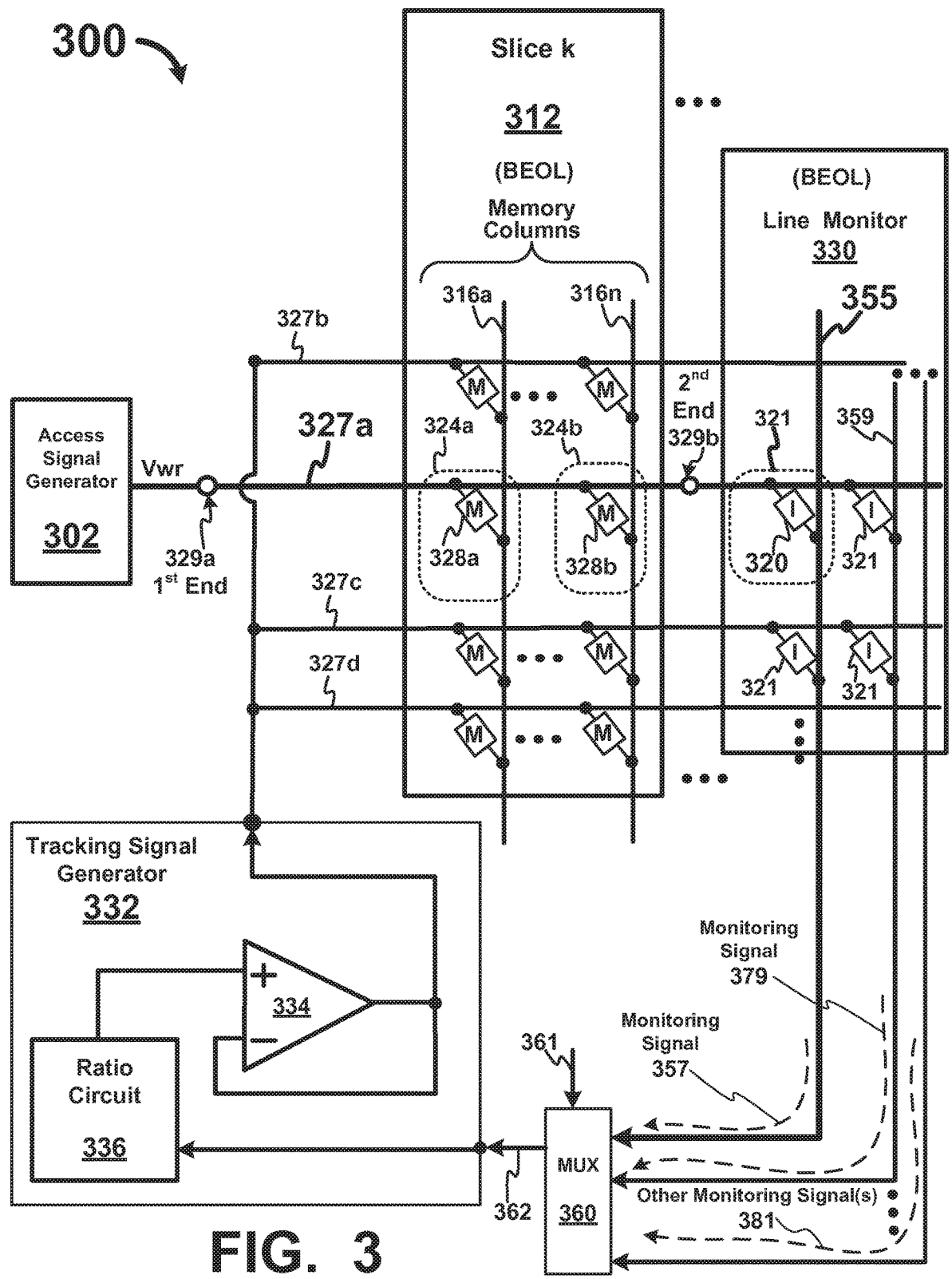
FIG. 3 depicts an example of a line monitor and an example of a tracking signal generator in accordance with various embodiments.

FIG. 3 depicts one example of a line monitor and one example of a tracking signal generator in accordance with various embodiments. Diagram 300 depicts an access signal generator 302 electrically coupled via a first end 329a of a word line 327a to a slice ("k") 312, which includes a number of bit lines ("memory columns") 316a to 316n. Slice k 312 includes memory cells 324a and 324b having memory elements 328a and 328b, respectively. As depicted, memory elements 328a and 328b are subject to a signal applied to word line 327a. Also shown is a tracking signal generator 332 configured to apply a tracking signal via word lines 327b, 327c and 327d to un-selected memory elements in slice k 312. A line monitor 330 is electrically coupled with word lines 327a, 327b, 327c and 327d. In the example shown, line monitor 330 includes an indicator bit line 355 (e.g., a y-line or bit line in an array) and one or more indicator resistive memory elements, such as indicator resistive memory element ("I") 320 electrically coupled with word line 237a and indicator bit line 355 and another indicator resistive memory element ("I") 321 electrically coupled with word line 327c and indicator bit line 355. For purposes of explanation, other indicator resistive memory elements that may be included in line monitor 330 and their respective word and bit lines are not depicted. Line monitor 330 is configured to sample, for example, a write voltage signal at a position adjacent to second end 329b, and is further configured to provide for real-time (or near real-time) word line voltage sensing and to convey monitoring signals 357 generated by indicator resistive memory element ("I") 320. The monitoring signals can be representative of a detected magnitude on word line 327a at or near second end 329b.

According to some embodiments, other indicator memory elements (not shown) can be disposed on indicator bit line or column 355 to monitor signals on other word lines. Or, other indicator memory elements, such as indicator memory elements 321, can be disposed on other indicator bit lines or columns, such as indicator bit line or column 359, to monitor signals on other word lines. In some embodiments, indicator memory elements 320 and 321 can be similar to or identical to the memory elements in slice 321, and can be configured to be in a predetermined state (e.g., an erased state, a programmed state, or some other state). Optionally, a multiplexer ("mux") 360 is electrically coupled 362 with the tracking signal generator 332 and the line monitor 330, which can be configured to multiplex monitoring signals 357 and 379 from indicator bit lines or columns 355 and 359 into tracking signal generator 332 in response to one or more signals 361. Mux 360 can optionally be electrically coupled with other monitoring signals 381 from line monitor 330. An example of a tracking signal generator 332 can include an amplifier circuit, such as op-amp 334, and a ratio circuit 336. An example of an op-amp 334 is an operational amplification circuit having unity gain. Ratio circuit 336 is a configurable circuit that provides either a reduced value or an enhanced value of monitoring signal 357 or other monitoring signal selected by mux 360. Therefore, ratio circuit 336, can be configured to adjust monitoring signal 357 (e.g., increase or reduce voltage magnitude) to compensate, for example, for process and other variations related to the array 110, the memory elements, the conductive array lines, just to name a few. Furthermore, ratio circuit 336 can be configured in-situ (e.g., during IC testing of die 790 or 799 in FIG. 11) to provide for an adjusted value of a monitoring signal. Consider the following examples. Ratio circuit 336 can be configured to reduce the magnitude of monitoring signal 357 by a factor of 0.9. Or, ratio circuit 336 can be configured to enhance the magnitude of monitoring signal 357 by a factor of 1.1. For example, ratio circuit 336 can be configured to enhance the magnitude of monitoring signal 357 by a factor in a range from about 0.1 to about 2.0. Data representative of the factors can be stored in an IC that includes the array 110, in registers, or in a sub-set of the memory elements in array 110 or some other array, for example. Preferably, the data representative of the factors is stored in non-volatile memory (e.g., such as the memory elements in array 110 or some other array).

Figure 4A:
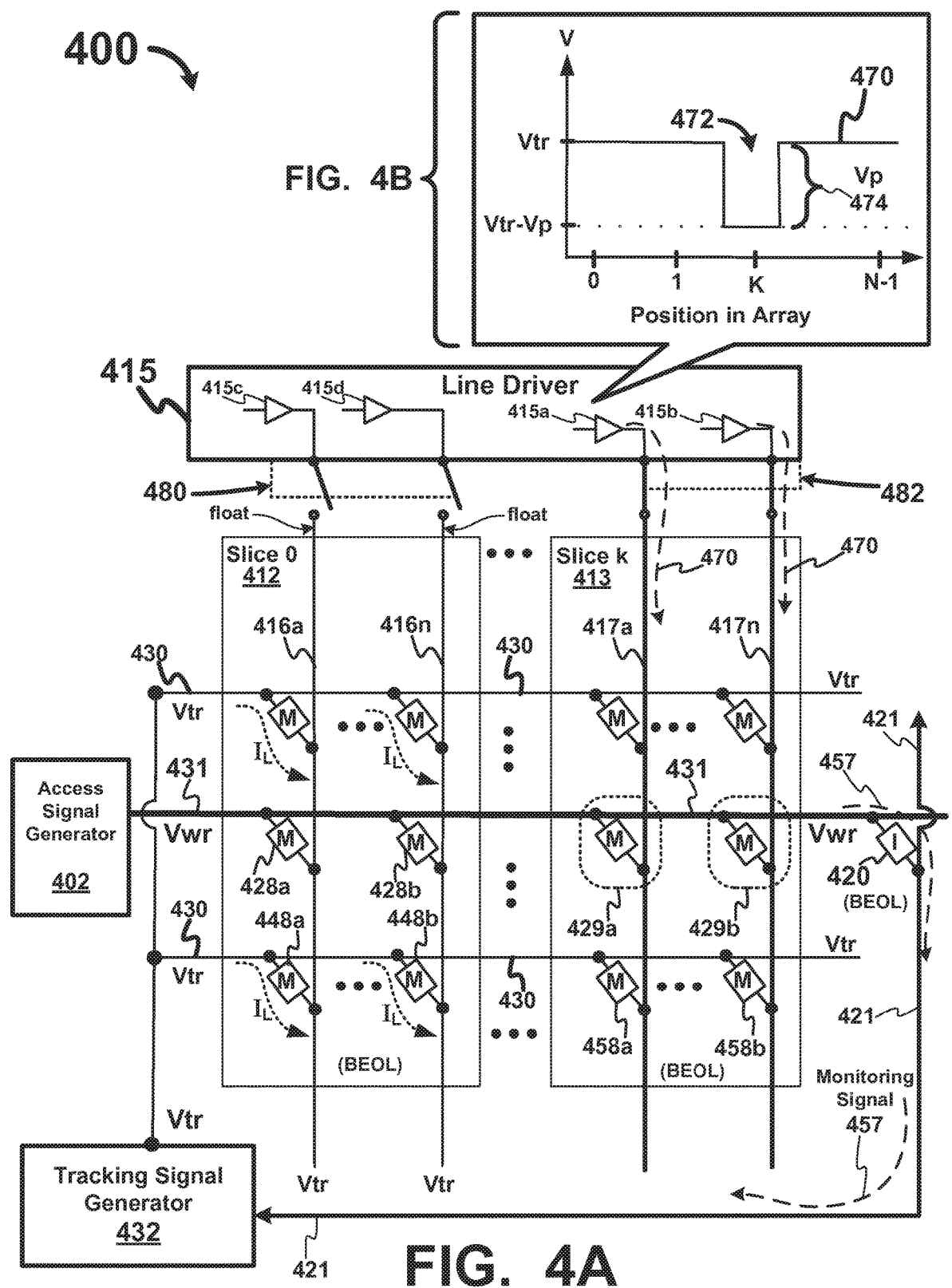
FIG. 4A depicts an example of a write operation using a tracking signal generator in accordance with various embodiments.

FIG. 4A depicts an example of a write operation using a tracking signal generator in accordance with various embodiments. Diagram 400 includes an access signal generator 402, tracking signal generator 432, a line driver 415, and slice 0 412 through slice k 413, with each slice including a plurality of memory elements. Further, diagram 400 depicts an access signal generator 402 coupled via a word line 431 to a slice ("0") 412, which includes a number of bit lines 416a to 416n, and to a slice ("k") 413, which includes a number of bit lines 417a to 417n. Slice k 413 includes memory elements 429a and 429b selected to have a writeable state when a signal is applied via word line 431 during a write operation. Line driver 415 is configured to apply a write voltage signal 470 (e.g., a program signal or an erase signal) to bit lines 417a to 417n in slice k 413, using for example, FEOL driver circuitry 415a and 415b which apply signal 470 when switches 482 are closed and electrically couple the drivers 415a and 415b with the bit lines 417a and 417n in slice k 413. In the example depicted in FIG. 4B, write signal 470 is a transitioning signal configured to include a waveform portion 472 (e.g., a pulse) that generates a program signal magnitude that varies from a tracking signal magnitude, Vtr, by, for example, an amount ("Vp") 474. While waveform portion 472 is applied to slice k 413 to perform a write operation, line driver 415 is configured to operate as one or more switches 480 which are switched opened in response to a signal to disconnect bit lines 416a to 416n from circuitry (e.g., FEOL drivers 415c and 415d) in line driver 415 or elsewhere, thereby allowing bit lines 416a to 416n to float from whatever voltage was on bit lines 416a and 416n at the time the switches 480 were opened.

Consider that slice k 413 is selected for a write operation, slice 0 412 and its memory elements are not selected for the write operation. Tracking signal generator 432 is configured to apply a tracking signal Vtr via word lines 430 to un-selected memory elements in slice 0 412. In particular, memory elements 428a and 428b in slice 0 412 are subject to a write signal having a modified magnitude to establish a write voltage signal, Vwr, on word line 431. Tracking signal generator 432 applies a tracking voltage signal, Vtr, to isolate half-selected memory elements 428a and 428b from the effects of the write voltage signal Vwr, thereby preserving the states of memory elements 428a and 428b. Memory elements 428a and 428b are half-selected because each has one terminal electrically coupled with selected word line 431 and each has another terminal electrically coupled with bit lines 416a and 416b, but only word line 431 is receiving the write voltage signal. As shown, tracking signal generator 432 receives a monitoring signal 457 generated by an indicator resistive memory element ("I") 420 having one of its terminals electrically coupled with selected word line 431 and the other terminal electrically coupled with tracking signal generator 432 via line 421. Line 412 can be a bit line dedicated to electrically coupling indicator memory elements I with the tracking signal generator 432. Tracking signal generator 432 applies tracking voltage signal, at least in some cases, via un-selected memory elements, such as memory elements 448a and 448b, to bit lines 416a to 416n. Here, bit lines 416a to 416n are initially at their floating voltages (float) and subsequently charge to the potential of the tracking signal Vtr due to leakage currents $\square_L$ that flow through un-selected memory elements 448a and 448b to the bit lines 416a to 416n and due to capacitive coupling between the floated bit lines 416a to 416n and the word line 430. Therefore, word lines 430 and bit lines 416a to 416n are at a tracking signal magnitude, Vtr, which is sufficient to maintain memory elements 448a and 448b and other memory elements electrically coupled with tracking signal magnitude, Vtr, in a non-writeable state. For example, with switch 480 open, bit lines 416a to 416n can float from the voltage they were at when switch 480 was opened to the voltage Vtr that is applied to word lines 430 by tracking signal generator 432. Note, too, when transitioning signal 470 is applied to bit lines 417a to 417n via switches 482, the potential difference across un-selected memory elements in slice k 413, such as memory elements 458a and 458b, is determined by the potential difference between tracking signal magnitude, Vtr, applied to word lines 430 and the voltage level on bit lines 417a to 417n. The potential difference is less than the amount required for modifying the memory state (e.g., the potential difference is at or below the half-select voltage for a write operation) and the data therein, and, thus, memory elements 458a and 458b remain in a non-writable state and the data operations on selected memory elements (429a, 429b) on word line 431 do not disturb, change, overwrite, or otherwise alter the data stored in un-selected memory elements on word lines 430 in slice 0 412.

Figure 5A:
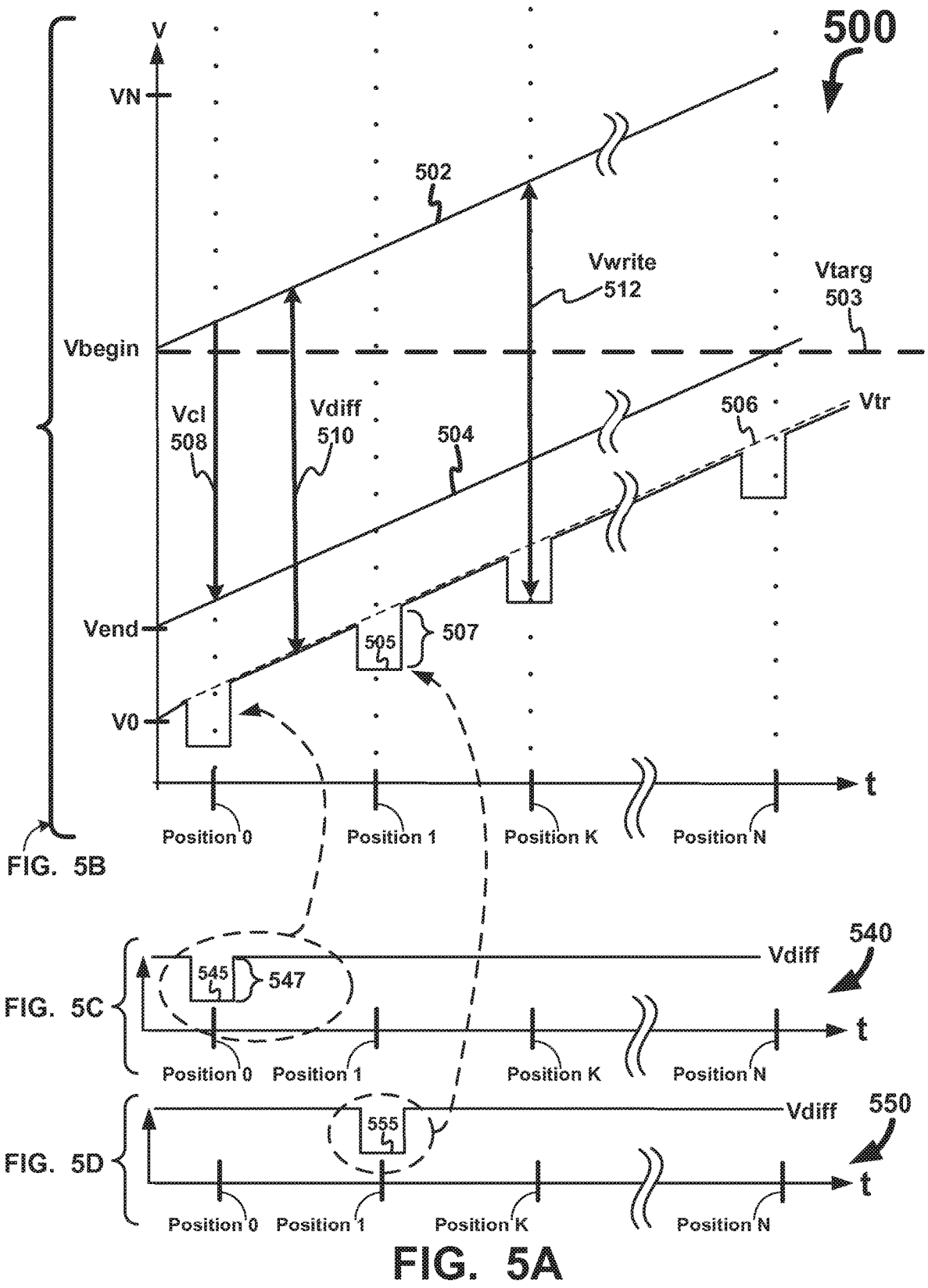
FIG. 5A depicts examples of relationships between voltage waveforms used during a write operation to one or more slices in accordance with various embodiments.

Turning now to FIG. 5A, various examples of voltage waveforms that can be used during a write operation to one or more slices are depicted. FIG. 5B is a diagram of a target signal tracking an access signal, such as a write signal magnitude, according to at least some embodiments. In the example shown in diagram 500, a target voltage ("Vtarg") 503 represents a target access voltage (e.g., a target write voltage) at a memory element positioned somewhere along a word line (e.g., from position 0 to position N). When a voltage drop exists along the word line, an access signal generator is configured to generate a modified magnitude for a signal to compensate for voltage variations due to the voltage drop along the word line. Therefore, a target write voltage can be delivered to a selected memory element. Relationship 502 in FIG. 5B depicts a voltage magnitude, Vbegin, of an access voltage applied to a memory element located at a position at the beginning of the word line or positioned closest to an access signal generator, whereas relationship 504 depicts a magnitude, Vend, of the access voltage applied to the memory element located at a position on the word line that is farthest from the access signal generator. Therefore, the cumulative voltage drop Vcl 508 represents the difference of a voltage applied to the $0^{th}$ position and the corresponding voltage at the $n^{th}$ position (e.g., due to the voltage drop on the word line). A potential difference, Vdiff, 510 represents a difference between a write voltage applied to one terminal of a memory element and a tracking voltage applied to another terminal, the potential difference between the write voltage and the tracking voltage being below a threshold at which the memory state of the memory element is modified (e.g., disturbed). Relationship 506 represents a tracking voltage that tracks or follows the write voltage.

Waveform portions 505 represent the application of a program signal applied to a bit line that provides an amount of voltage deviation 507 from the magnitude of the tracking signal. The voltage deviation 507 that enhances (or varies) the potential difference ("Vdiff") 510 to establish Vwrite 512 across a selected memory element, whereby the combined potential difference Vidff 510 and voltage deviation 507 are sufficient to place a memory in a writeable state to perform a write operation. Note that each of positions 0, 1, k, and N can represent one or more bit lines, including subset of bit lines to which a transitioning signal can be applied. In some examples, as depicted in FIG. 5C, a transitioning signal 540 can be applied to a first subset of bit lines associated with position 0, the transitioning signal 540 having a magnitude 545. Magnitude 545 can represent an amount 547 that deviates (e.g., a voltage deviation) from a different amount applied over a memory element. Amount 547 plus amount Vidff 510 is sufficient to transition a memory element from a non-writeable state into a writeable state. In one example, amount 547 can represent a negative voltage (e.g., about −1.0V). Further, as depicted in FIG. 5D, another transitioning signal 550 having a magnitude 555 is applied to a word line to transition a memory element associated with position 1 from a non-writeable state into a writeable state to commence a write operation. Magnitude 555 can be the same as magnitude 545, or can vary therefrom as a function of position. As used herein, the term "transitioning signal" can refer to a signal or a magnitude of a signal that is configured to vary the potential difference across a memory element in a non-accessible state by an amount to transition the memory element into an accessible state. Note that while the transitioning signal 540 is depicted as having a negative magnitude or pulse, other signals, including the access signal, can be varied to achieve the same result (i.e., an enhanced deviation of the potential difference). Therefore, in at least some embodiments, a "write" voltage signal may have a magnitude that may not be sufficient to write to a memory element. Rather, a "write" voltage signal has a magnitude that facilitates a write operation. As such, the combined effects of a "write" voltage signal and a "transitioning signal" can provide for access to a memory element for performing a write operation (e.g., program or erase), as well as other data operations, such as a read operation. Although the transitioning signals 540 and 550 are depicted as having a negative magnitude or pulse, the transitioning signals can also have a positive magnitude or pulse and can have a pulse shape different than that depicted in FIGS. 5C and 5D. Moreover, the shape of the waveform applied for the transitioning signals will be application dependent and can include one or more pulses and those pulses can have simple waveform shapes (e.g., a square wave) or complex waveform shapes.

FIG. 6A depicts a tracking signal generator implemented with an access signal generator that includes a slice-rolling controller, according to various embodiments. As shown in diagram 600, an access signal generator 602 is configured to control a word line driver 604 to generate word line voltages with modified magnitudes. In some examples, word line driver 604 can be disposed between and electrically coupled with different arrays, such as array 630 and array 640 (or electrically between portions of arrays). In that the word line driver 604 can be a FEOL circuit that is fabricated on a substrate (e.g., a silicon wafer or die) that the arrays 630 and 640 are fabricated BEOL directly above, the term "disposed between" can include floor planning the layout of the FEOL circuitry and the BEOL memory arrays so that the physical location of the circuitry for the word line driver 604 results in the circuitry being positioned between the BEOL arrays 630 and 640. As one example, a dashed line 691 demarcates a midpoint between BEOL arrays 630 and 640 such that distance d1=d2. The layout and floor planning of the FEOL and BEOL portions can be configured such that FEOL word line driver 604 has a position in the FEOL logic layer 770 (see FIG. 7A) that is directly under the BEOL arrays and is symmetrically positioned or approximately symmetrically positioned between the midpoint (i.e., line 691) of those arrays (630 and 640). For example, in FIG. 6A, the arrays 630 and 640, their associated slices, conductive array lines, memory elements, and line monitors can be fabricated BEOL; whereas, the access and control circuitry can be fabricated FEOL. Array 630 includes slice ("1") 632a, slice ("3") 632b, and slice ("N") 632n, whereas array 640 includes slice ("0") 642a, slice ("2") 642b, and slice ("N-1") 642n. In at least one embodiment, slice-rolling controller 604 is configured to "roll" thorough slices 632 and 642 to apply modified magnitudes of one or more access signals sequentially to the slices. For example, slice-rolling controller 604 can generate and apply a first modified magnitude of a write voltage to a group of memory elements associated with a group of bit lines (e.g., in slice 0 642a) during a first interval of time, and can apply a second modified magnitude of a write voltage to another group of memory elements associated with another group of bit lines (e.g., in slice 2 642b) during a second interval of time. Further, slice-rolling controller 604 can be configured to apply the same magnitude of an access signal to different positions in arrays 630 and 640, simultaneously, substantially simultaneously, or during different periods of time. In some examples, the different positions can be substantially equidistant from access signal generator 602. In a specific implementation, slice-rolling controller 604 can be configured further to increase the value of the modified magnitude as the distance increases between the different positions and access signal generator 602. In FIGS. 6B and 6C, tracking signal generator 632 is configured to generate a tracking signal having a magnitude that tracks first magnitude 620 and second magnitude 610 of the write voltages by a differential amount ("Vdiff") 617b and differential amount ("Vdiff") 617a, respectively. Note that the differential amount can represent a range of voltages from which the tracking signal magnitude can deviate from the first and second magnitudes of the write voltages while preserving the states (e.g., not disturbing the value of stored data) of the memory elements subject to the differential amount.

To illustrate, consider that slice-rolling controller 604 is configured to generate modified magnitudes as depicted in relationships 610 and 620 in FIG. 6B and FIG. 6C respectively. For example, slice-rolling controller 604 can be configured to generate magnitude ("V0") 622a for transmission to a memory element at a position "0" in slice 0 642a, and to generate magnitude ("V1") 612a for transmission to a memory element at a position "1" in slice 1 632a. Note that magnitudes V0 622a and V1 612a can be different, the same, or substantially the same. Tracking signal generator 632 is configured to generate one or more tracking signals having a magnitude that tracks magnitude V0 622a for a first subset of memory elements associated with the memory element at a position "0" and magnitude V1 612a for a second subset of memory elements associated with the memory element at a position "1." For example, tracking signal generator 632 is configured to track magnitude V0 622a and generate one or more tracking signals having a magnitude 624a, and to track second magnitude V1 612a and generate one or more tracking signals having a magnitude 614a. The tracking signals have magnitudes that differ from magnitude V0 622a and magnitude V1 612a by differential amount Vdiff 617b and differential amount Vdiff 617a, respectively. Note that the differential amount can represent a range of voltages from which the tracking signal magnitude can deviate from the first and second magnitudes of the write voltages while preserving the states of the memory elements subject to the differential amount as the slice-rolling controller 604 "rolls" through the slices. Examples of memory elements in the above-described first subset of memory elements can include memory elements electrically coupled with a word line receiving a write voltage (e.g., in another slice) and memory elements electrically coupled with a bit line receiving a transitioning signal (e.g., in the slice at which the selected memory element is being written). Examples of memory elements in the above-described second subset of memory elements can include memory elements similar to the first subset of memory elements, but reside in a different array, such as array 630, or a portion of an array(s).

Subsequently, slice-rolling controller 604 can be configured to generate magnitude ("V2") 622b for transmission to a memory element at a position "2" in slice 2 642b, and to generate magnitude ("V3") 612b for transmission to a memory element at a position "3" in slice 3 632b. Note that magnitudes V0 622b and V3 612b can be different, the same, or substantially the same, and can be greater than magnitudes V0 622a and V1 612a. Tracking signal generator 632 is configured to generate one or more tracking signals having a magnitude that tracks magnitude V2 622b for a third subset of memory elements associated with the memory element at a position "2," and is further configured to track magnitude V3 612b for a fourth subset of memory elements associated with the memory element at a position "3." For example, tracking signal generator 632 is configured to generate one or more tracking signals having a magnitude 624b to track magnitude V2 622b, and is further configured to generate one or more tracking signals having a magnitude 614b to track second magnitude V3 612b by differential amount Vdiff 617b and differential amount Vdiff 617a, respectively.

In one embodiment, slice-rolling controller 604 can be configured to apply magnitudes 612a and 622a to respective slices 1 632a and 0 642a simultaneously (e.g., to effect simultaneous writes of memory elements in slices 1 632a and 0 642a), with subsequent simultaneous application of magnitudes 612b and 622b to respective slices 3 632b and 2 642b. Likewise, tracking signal generator 632 can be configured to apply magnitudes 624a and 614a to respective slices 0 642a and 1 632a simultaneously (e.g., to effect simultaneous writes of memory elements in slices 0 642a and 1 632a), with subsequent simultaneous application of magnitudes 624b and 614b to respective slices 2 642b and 3 632b. In some embodiments, simultaneous writes can be replaced with writes that are substantially simultaneous (e.g., the occur nearly simultaneously in time but not exactly at the same time) In another embodiment, slice-rolling controller 604 can be configured to apply magnitudes 612a and 622a to respective slices 1 632a and 0 642a at different intervals of time (e.g., to effect staggered writes of memory elements in slices 1 632a and 0 642a), such as depicted in diagram 600.

As depicted in FIG. 6A, slice-rolling controller 604 first applies a first modified magnitude to slice 0 642a during a first time interval (dashed arrow 681), and then applies the first modified magnitude to slice 1 632a during a second time interval (dashed arrow 682). Next, slice-rolling controller 604 then applies a second modified magnitude to slice 3 632b during a third time interval (dashed arrow 683), and then applies the second modified magnitude to slice 2 642b during a fourth time interval (dashed arrow 684). Likewise, tracking signal generator 632 can be configured to track the above-described application of the modified magnitudes from the first time interval to the fourth time interval by applying magnitudes 624a and 614a to respective slices 0 642a and 1 632a at different intervals of time (e.g., to effect staggered writes of memory elements in slices 0 642a and 1 632a), with subsequent sequential application of magnitudes 624b and 614b to respective slices 2 642b and 3 632b. Slice-rolling controller 604 and/or tracking signal generator 632 can operate in accordance with other schemes and are not limited to the above-described examples (e.g., simultaneously, substantially simultaneously, or other timing for application of write voltages and/or tracking voltages to one or more slices).

Figure 7A:
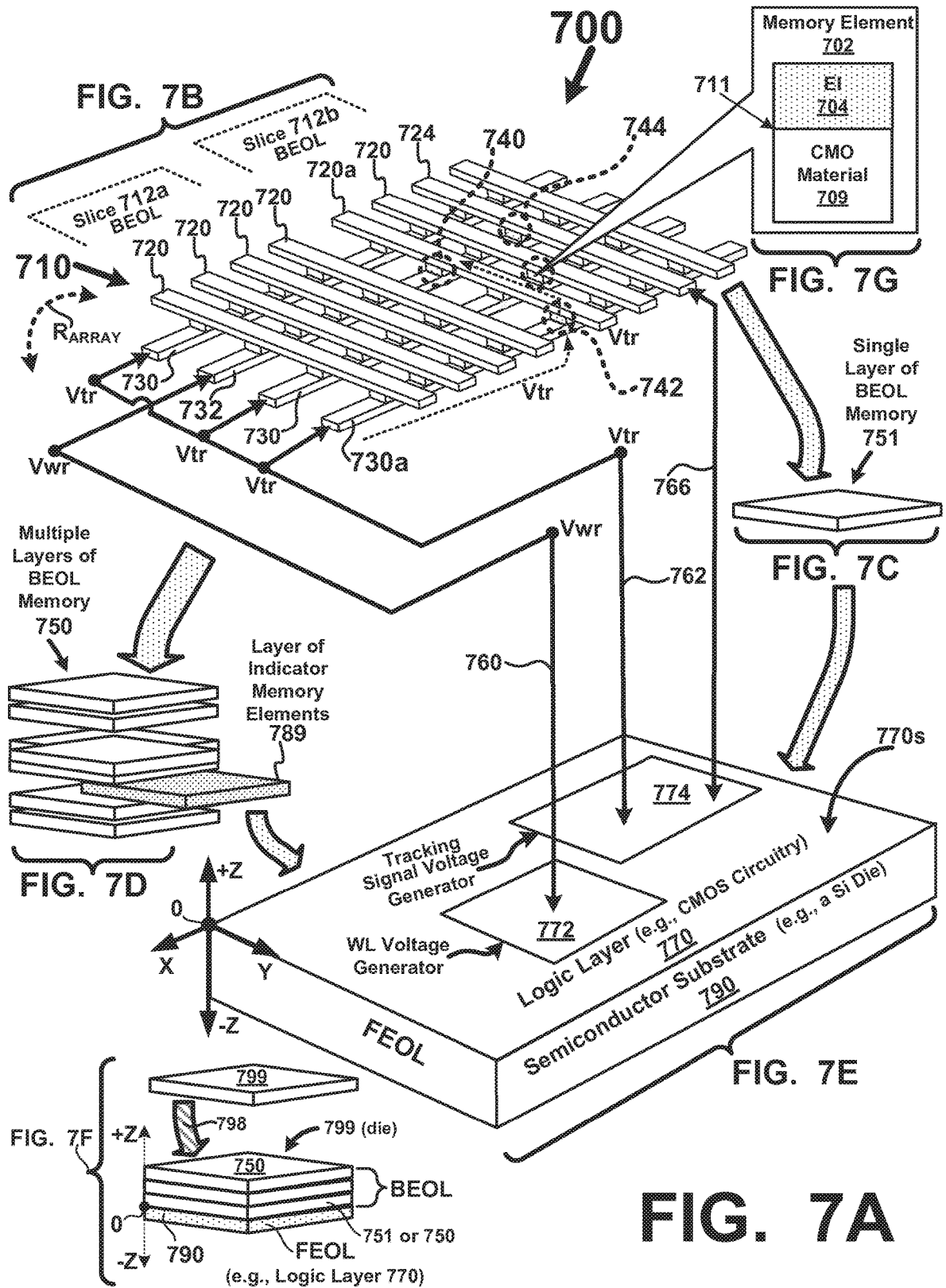
FIG. 7A depicts an example of a BEOL array of memory elements including a single layer of memory or multiple layers or planes of memory and their associated FEOL logic layer, according to various embodiments.

FIG. 7A depicts an example of a two-terminal cross-point array of memory elements including multiple layers of memory, according to various embodiments. Although multiple layers of memory are depicted, the cross-point array can include only a single layer of memory. In this example, diagram 700 depicts a portion 710 of a BEOL cross-point array that forms a single layer of memory 751 in FIG. 7C or one of multiple layers of BEOL memory 750 as depicted in FIG. 7D, which are fabricated BEOL directly above a FEOL substrate 790 including a FEOL logic layer 770 as depicted in FIG. 7E and in FIG. 7F. Here, the FEOL substrate layer 790 has the FEOL circuitry (e.g., CMOS circuitry) fabricated first on the FEOL logic layer 770 (e.g., along the −Z axis) and subsequently, each BEOL memory layer is fabricated directly above an upper surface 770s of a completed logic layer 770 (e.g., along a +Z axis). Each BEOL memory layer is in contact with an adjacent BEOL memory layer and a bottommost of the BEOL memory layers is in contact with the substrate 790 (e.g., the surface 770s of a silicon die or wafer). Each memory layer 751 or 750 can be regarded as a memory plane that includes at least one two-terminal cross-point memory array. When a plurality of memory planes 750 are used, each memory plane 750 is in contact with an adjacent plane and the planes are vertically stacked along the +Z axis. As shown, portion 710 of the cross-point array includes conductive X-lines 730 and 732, and is partitioned into slices 712a and 712b, each slice including a subset of conductive Y-lines, including Y-lines 720 and 724. In one embodiment, a slice or multiple slices can include at least one Y-line 724 configured as an indicator column and a number of Y-lines 720 that are configured as memory columns. According to various embodiments, the one or more indicator columns are optional. In one example, the indicator columns can be implemented at one end of conductive X-lines 730 and 732, where the end is electrically disposed farther from a word line ("WL") voltage generator 772. Note that while FIG. 7B depicts slices 712a and 712b being oriented in a layer of memory coincident with an X-Y plane, slices 712a and 712b are not limited to the X-Y plane and can oriented in the Y-Z and X-Z planes, according to other embodiments. Further, each of slices 712a and 712b can include multiple sets of Y-lines 720, with each set being disposed at different X-Y planes along the Z-axis relative to the logic layer 770.

Word line ("WL") voltage generator 772 is configured to generate a write voltage signal having a modified magnitude, Vwr, for transmission via path 760 to a selected word line 732. The write voltage signal is applied via X-line 732 to a terminal of an un-selected memory element 740 for accessing another selected memory element (not shown) to perform a write operation on the selected memory element, and to a terminal of an indicator memory element 744 for generating a monitoring signal on Y-line 724. Tracking signal voltage generator 774 is configured to receive a monitoring signal via path 766 from the indicator memory element 744, and, in response, generate a tracking voltage signal having a magnitude, Vtr, for transmission via path 762 to one or more un-selected word lines 732. In the example shown, the tracking signal voltage is applied to X-line 730a, which, in turn, can be applied via memory element 742 to Y-line 720a, which is electrically coupled with a terminal of memory element 740. Thus, a different amount of voltage exists across un-selected memory element 740 between Y-line 720a (e.g., at a magnitude Vtr) and X-line 732 (e.g., at a magnitude Vwr). The positioning of indicator memory elements within the single layer of memory 751 or within the multiple layers of memory 750 will be application dependent. For example, an additional number of word and bit lines in each slice can be dedicated to support a plurality of indicator memory elements. Indicator memory elements can be disposed in a tracking array embedded in a single layer 751 or in multiple layers 750 of memory. If multiple layers of memory 750 are implemented, then one of the multiple layers (e.g., a layer 789) can include one or more tracking arrays that include the indicator memory elements, or one or more of the multiple layers 750 can include at least one tracking array and its associated indicator memory elements. Thus, indicator memory elements 744 can be disposed on the same layer of memory or can be distributed over multiple layers of memory. In at least one embodiment, each of the indicator memory elements 744 is disposed in the same layer of memory as are the slices to which the particular indicator memory element relates.

Further to the example shown, portion 710 of a cross-point array that forms one of multiple layers of memory 750 can be formed on or above a substrate 790, which includes logic layer 770 having active circuitry operative to perform data operations on the one or more memory layers 750. The substrate 790 can be a silicon ("Si") wafer upon which circuitry in the logic layer 770 (e.g., CMOS circuitry) is fabricated as part of a front-end-of-the-line ("FEOL") fabrication process. An inter-layer interconnect structure (not shown) fabricated as part of the FEOL processing can include electrically conductive interconnect structures (e.g., vias, through-holes, plugs, contacts, or the like) configured to electrically couple the circuitry in the logic layer 770 with one or more memory layers (751, 750) that are fabricated directly on top of and in direct contact with the substrate 790. Subsequently, the one or more layers of memory (751, 750) can be fabricated directly on top of an upper surface 770s (e.g., along the +Z axis) of the substrate 790 as part of a back-end-of-the-line ("BEOL") fabrication process tailored for fabricating non-volatile two-terminal cross-point memory arrays. Upper surface 770s can be the uppermost surface of the aforementioned FEOL inter-layer interconnect structure. If multiple layers of BEOL memory 750 are fabricated, the multiple layers are vertically stacked upon one another along the +Z axis. After FEOL and BEOL processing are completed, the silicon wafer can be singulated into individual silicon die 799 as depicted in FIG. 7F, with each die 799 being a monolithically integrated circuit having a FEOL portion 790 with active circuitry 770 fabricated thereon and a BEOL memory portion (e.g., either a single layer of memory 751 or a plurality of vertically stacked layers of memory 750) that are a unitary whole, that is, the BEOL portion is grown using microelectronics fabrication processes directly on top of the FEOL portion to form a single die 799 that can be mounted in a suitable IC package (not shown) and wire bonded or the like to electrically couple the die 799 with pins on the package, for example. The die 799 is not formed using conventional processes such as wafer bonding, multi-chip modules, soldering components to each other, gluing, PC-boards, or the like. Instead, die 799 comprises a monolithic IC or ASIC that includes inseparable FEOL circuitry and BEOL memory. Therefore, in FIG. 7F die 799 is a unitary whole and arrow 798 points to a profile cross-sectional view depicting the demarcations between the various connected layers of die 799 with the FEOL substrate layer 790 and its associated logic plane 770 with active circuitry positioned along the −Z axis and one layer (751) or multiple (750) layers of BEOL memory fabricated in direct contact with and directly above the FEOL substrate layer 790 (e.g., starting at upper surface 770s) along the +Z axis. Here, the 0 point on the Z axis demarcates the beginning points for the +Z and −Z axes. In FIG. 7F, arrow 798 points to a more detailed illustration of the die 799 and depicts the various layers of die 799. In the example depicted, die 799 can include only one layer 751 of BEOL memory fabricated directly above FEOL logic plane 770 of substrate 790, or die 799 can include multiple layers 750 of BEOL memory that are vertically stacked upon one another, are in contact with one another, and a bottommost layer of the vertically stacked layers 750 is in direct contact with the FEOL logic plane 770 of substrate 790. In that case, the bottommost layer is a layer 750 and not the layer 751. The die 799 with only the single layer 751 of BEOL memory and with the multiple layers (e.g., two or more layers) of vertically stacked BEOL will be described in more detail below in regards to FIG. 11.

In some embodiments, a memory element described in FIG. 7D or any figure herein can be implemented as a resistive memory element 702 that includes a structure 704 including an electrolytic insulator ("EI") in contact with a structure 709 including one or more layers of a conductive metal oxide material (CMO) that includes mobile oxygen ions. Memory element 702 further includes two terminals (not shown). Examples of terminals include but are not limited to one or more layers of electrically conductive materials operative as an electrode. In various embodiments, electrolytic insulator 704 can include a material for implementing a tunnel barrier layer having a thickness that is approximately 50 Angstroms or less. The material selected for the electrolytic insulator 704 can be an electrolyte to the mobile oxygen ions during write operations to the memory element 702 such that the mobile oxygen ions are transported between the layer 704 and 709 by an electric field generated by application of the write voltage across the electrically in series combination of the electrolytic insulator 704 and the CMO 709. Further, the material selected for the electrolytic insulator 704 has its thickness selected to allow for electron tunneling during data operations to the memory element 702.

In FIG. 7A, the spatial orientation of the memory layers (751 and 750 in FIGS. 7D, 7C, and 7F) and array 710 FIG. 7B is not limited to the examples depicted and the memory planes need not be vertically stacked along the Z-axis and can instead be oriented along the X-axis or Y-axis (e.g., a horizontal stacking). Furthermore, the X-lines and Y-lines of array 710 need not be oriented in an X-Y plane, instead those lines can be oriented in a Y-Z plane or an X-Z plane, such that the X-lines and the Y-lines extend along the Z-axis by rotating $R_{ARRAY}$ the array 710 relative to some reference such as the plane of the substrate 790 (e.g., the array 710 can be rotated 90 degrees relative to the X-Y plane or the plane of the upper surface 770s of substrate 790). Essentially the memory layers (751, 750) and their respective array(s) are rotated relative to the plane of the substrate 790, for example.

Turning now to FIG. 8A, configuration 800 depicts a discrete two-terminal memory element 802 positioned between a cross-point of two conductive array lines 720 and 730. Memory element (ME) 802 can be re-writeable and non-volatile. For example, conductive array lines 720 and 730 can be a subset of the plurality of conductive array lines in a two-terminal cross-point array, such as the array 710 of FIG. 7B. Discrete memory element 802 is directly electrically in series with its respective conductive array lines 720 and 730, that is, there are no other active elements in memory cell 803 other than the memory element 802B itself. Active layers of the memory element 802, such as layers 704 and 709 of FIG. 7G, for example, can be electrically coupled with the conductive array lines 720 and 730 using one or more layers of thin film materials operative as electrodes (not shown) or the like. The structure depicted in FIG. 8A can be fabricated BEOL along the +Z axis. In some embodiments, discrete memory element 802 can be a component of a memory cell 803 as depicted by the dashed lines. Memory cell 803 includes the memory element 802 and can include other structures such as a portion of the conductive array lines 720 and 730. In that the memory cell 803 includes a discrete two-terminal memory element 802, the terms memory cell and memory element can be used interchangeably. In FIG. 8B, configuration 810 is a schematic depiction of the discrete two-terminal memory element 802 of FIG. 8A and includes a first electrode or terminal 805 and a second electrode or terminal 807 that electrically couple the memory element 802 with conductive array lines 720 and 730 such that the memory element 802 is directly electrically in series with its respective terminals 705 and 707 and with its respective conductive array lines 720 and 730.

In FIG. 8B, the memory element 802 is schematically depicted as a variable resistance device in that data stored in the memory element 802 can be reversible written to different resistive values (e.g., changes in conductivity) by the application of a write voltage of appropriate magnitude and/or polarity across the terminals 805 and 807 (e.g., by applying the write voltage across conductive array lines 720 and 730). The resistive state of the stored data can be determined by applying a read voltage of appropriate magnitude and/or polarity across the terminals 805 and 807 (e.g., by applying the read voltage across conductive array lines 720 and 730). Typically the magnitude of the read voltage is less than the magnitude of the write voltage. Preferably, the application of the read voltage is non-destructive (e.g., does not disturb or change) to the resistive value of the stored data. The application of the read voltage generates a signal, such as a read current $\square_{READ}$, that flows through the memory element 802, for example. Sense amp circuitry (e.g., in the FEOL circuitry layer) can be used to determine a magnitude of the read current $\square_{READ}$ and to output a signal, such as a data value indicative of the magnitude of the read current $\square_{READ}$, or some other signal. As one example, data values of logic "1" or logic "0" can be the output signal for single level cell (SLC) that stores 1-bit of data. As another example, data values of "00", "01", "10" and "11" can be the output signal for a multilevel cell (MLC) that stores at least 2-bits of data. For example, if each memory element 802 stores 1-bit of non-volatile data (e.g., SLC), a programmed state can represent a high resistance state or a logic "0" and an erased state can represent a low resistance or a logic "1". As one example, given the same magnitude of the read voltage, the magnitude of the read current $\square_{READ}$ will be higher in the erased state (low resistance) and will be lower in the programmed state (high resistance). For MLC, the magnitude of the read current $\square_{READ}$ will depend on the resistance values for the various resistive states for "00", "01", "10" and "11". The actual resistance values for each state will be application dependent and the above values are non-limiting examples. Furthermore, in some applications, the non-volatile data can be stored as a plurality of conductivity profiles that can be non-destructively determined by applying the read voltage and can be reversibly written by applying the write voltage. Moreover, the term non-volatile as used herein means that the stored data is retained in the absence of electrical power (e.g., AC, DC, battery power, etc.). For MLC, each memory element 802 can be configured to store at least 2-bits of non-volatile data.

Moving on to FIG. 8C, a memory cell 820 depicts one example of a non-discrete memory element 821 in that the memory cell 820 includes a selection device 828 that is electrically coupled with one of the terminals (e.g., 826 or 827) of two-terminal memory element 821. The selection device 828 is operative to electrically block (e.g., gate or attenuate current or voltage) data operations access to the memory element 821 based on a signal or magnitudes of voltages for data operations applied across conductive array lines 720 and 730. The selection device 828 is a component of the memory cell 820 and is electrically in series with the memory element 821. Examples of selection devices include but are not limited to a non-ohmic device (NOD), a transistor, a diode, a pair of back-to-back diodes, and a metal-insulator-metal device. In some applications the words NOD and selection device are used interchangeably. In configuration 830 of FIG. 8D, selection device 828 comprises a single diode having one terminal 822 that can be electrically coupled with one of the conductive array lines (e.g., array line 720) and another terminal 825 electrically coupled with one of the terminals (e.g., 826) of the memory element 821. In some embodiments the memory element 821 and the selection device 828 share a common terminal. The orientation of the selection device 828 (e.g., anode and cathode) will be application specific and need not be the same as depicted in FIG. 8D. Configuration 830 is sometimes denoted as a 1D-1R memory cell because the memory cell includes one diode 828 and one resistive memory cell 821.

Reference is now made to FIG. 8E where configuration 840 depicts a selection device 828 comprised of a pair of back-to-back diodes having one terminal 822 that can be electrically coupled with one of the conductive array lines (e.g., array line 720) and another terminal electrically coupled with one of the terminals (e.g., 826) of the memory element 821. In some embodiments the memory element 821 and the selection device 828 share a common terminal. The orientation of the selection device 828 (e.g., anodes and cathodes) will be application specific and need not be the same as depicted in FIG. 8E. Configuration 840 is sometimes denoted as a 2D-1R memory cell because the memory cell includes two diodes 828 and one resistive memory cell 821.

Attention is now directed to FIG. 8F where configuration 850 depicts a selection device 828 comprised of a FET having a first terminal 822 (e.g., a source node) that can be electrically coupled with one of the conductive array lines (e.g., array line 720), a second terminal 825 (e.g., a drain node) electrically coupled with one of the terminals (e.g., 826) of the memory element 821, and a third terminal 853 (e.g., a gate node) electrically coupled with a control source operative to turn the FET on or off based on a voltage applied to the third terminal 853. When the FET is on, current can flow between source and drain nodes. When the FET is off, current flow between source and drain nodes is blocked. Configuration 850 is sometimes denoted as a 1T-1R memory cell because the memory cell includes one transistor 828 and one resistive memory cell 821. In some applications, more than one transistor (e.g., a 2T-R or 3T-R) can be used to implement selection device 828.

In FIG. 8G, configuration 860 depicts a MIM type of NOD comprised of a selection device 828 that includes two metal layers (M) or electrodes 822 and 825 and at least one layer of a high-k dielectric material 861 (□) sandwiched between the electrodes 822 and 825. Typically, thicknesses of the one or more layers of the high-k dielectric material are selected to allow current flow (e.g., via electron tunneling) during application of data operation voltages across the terminals (720, 730) of the memory cell 820 and to block current flow through the memory cell 820 for voltages other than those for data operations. In some embodiments the MIM selection device 828 includes a plurality of high-k dielectric layers that are in contact with one another, such as layers 861, 863 and optionally additional high-k dielectric layers. Although layers 861 and 863 are depicted as not being connected with one another for purposes of illustration, it should be noted that all of the high-k dielectric layers are in contact with one another and are electrically in series with their respective electrodes 822 and 825. Here electrode 822 can be electrically coupled with one of the conductive array lines (e.g., array line 720) and electrode 825 can be electrically coupled with one of the terminals (e.g., 826) of the memory element 821.

In FIGS. 8C-8G, the selection devices 828 depicted typically have specifically tailored I-V characteristics (e.g., a non-linear I-V characteristic) that is independent of any I-V characteristic of the memory element 821 itself. The I-V characteristic can provide rectification that prevents electrical access or disturbance of the memory element 821 for non-data operation voltages applied across the memory cell 820 (e.g., half-select voltages across half-selected memory cells during read and write operations). Further, application of data operation voltages across array lines 720 and 730 results in a first voltage drop $V_{drop1}$ across the selection device 828 and a second voltage drop $V_{drop2}$ across the memory element 821 (e.g., based on its resistive state). Accordingly, higher magnitudes of read and write voltages may be required when the selection device 828 is included in the memory cell 820 to compensate for the voltage drop across the selection device 828. Introduction of the selection device 828 increases the number of photo-masks and number of masking steps, as well as the number of processing steps and their concomitant risk of a yield reducing error and increased manufacturing costs.

Figure 9:
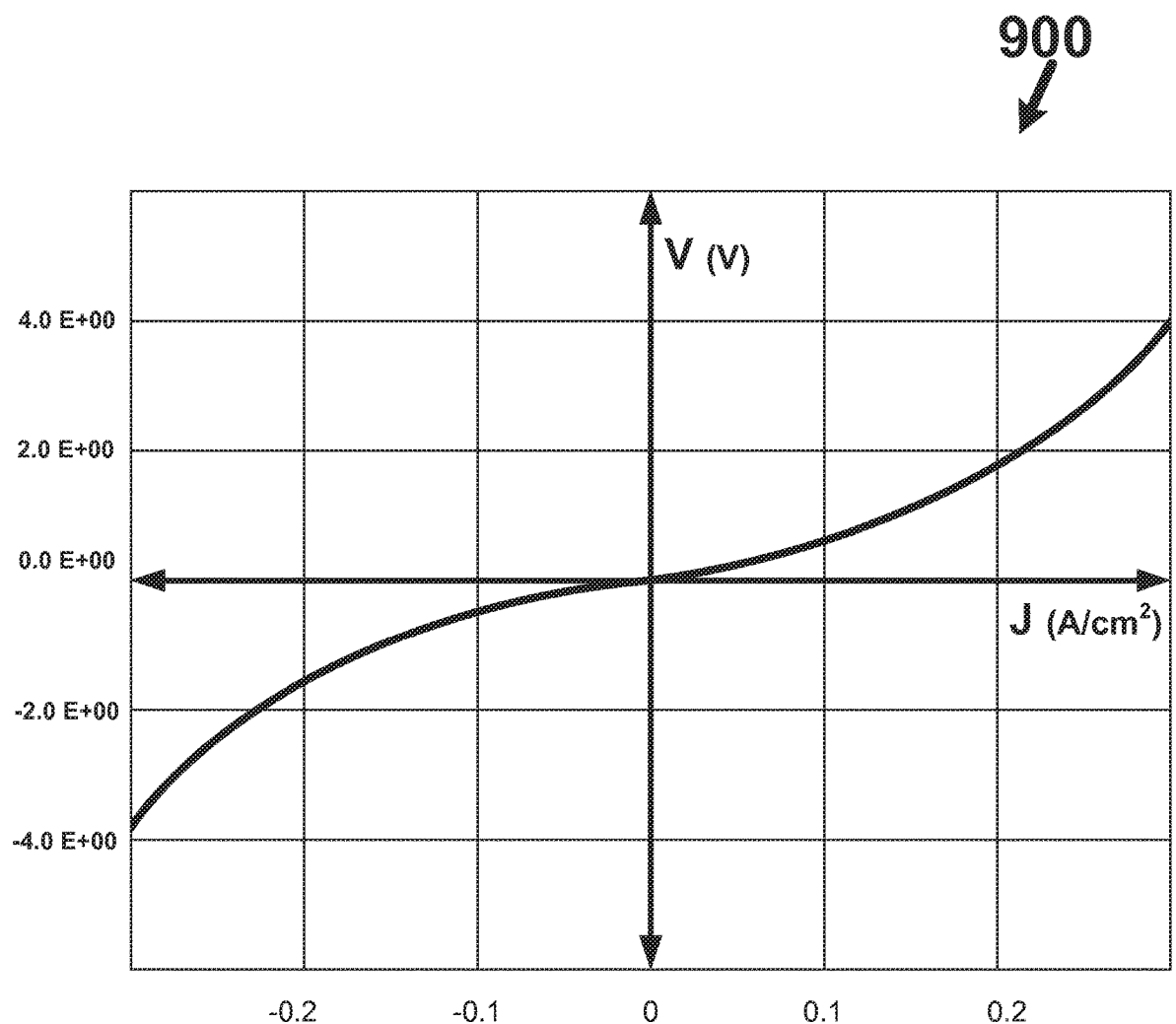
FIG. 9 depicts a graphical representation of a non-linear I-V characteristic for a discrete memory element with integral selectivity, according to various embodiments.

FIG. 9 graphically depicts one example of a non-linear I-V characteristic 900 for a discrete two-terminal memory element (e.g., the memory element 702 of FIGS. 7A and 10A-10D) having integral selectivity due to its non-linear I-V characteristics and the non-linear I-V characteristic is maintained regardless of the value of the data stored in the memory cell, that is the I-V characteristic of the memory element does not change from non-linear to linear as a function of the resistive state stored in the memory element. Therefore, the non-linear I-V characteristic of the memory element is non-linear for all values of stored data (e.g., resistive states). Voltage V applied across the memory element is plotted on the Y-axis and current density J through the memory element is plotted on the X-axis. Here, current through the memory element is a non-linear function of the applied voltage across the memory element. Accordingly, when voltages for data operations (e.g., read and write voltages) are applied across the memory element, current flow through the memory element does not significantly increase until after a voltage magnitude of about 2.0V (e.g., at ≈0.2 A/cm²) is reached (e.g., a read voltage of about 2.0V across the memory element). An approximate doubling of the voltage magnitude to about 4.0V does not double the current flow and results in a current flow of ≈0.3 A/cm². The graph depicted is only an example and actual non-linear I-V characteristics will be application dependent and will depend on factors including but not limited to an area of the memory element (e.g., area determines the current density J) and the thin-film materials used in the memory element, just to name a few. The area of the memory element will be application dependent. Here, the non-linear I-V characteristic of the discrete memory element applies to both positive and negative values of applied voltage as depicted by the non-linear I-V curves in the two quadrants of the non-linear I-V characteristic 900.

One advantage of a discrete two-terminal memory element that has integral selectivity due to a non-linear I-V characteristic is that when the memory element is half-selected (e.g., one-half of the magnitude of a read voltage or a write voltage is applied across the memory element) during a data operation to a selected memory cell(s), the non-linear I-V characteristic is operative as an integral quasi-selection device and current flow through the memory element is reduced compared to a memory cell with a linear I-V characteristic. Therefore, a non-linear I-V characteristic can reduce data disturbs to the value of the resistive state stored in the memory element when the memory element is un-selected or is half-selected.

Figure 10A:
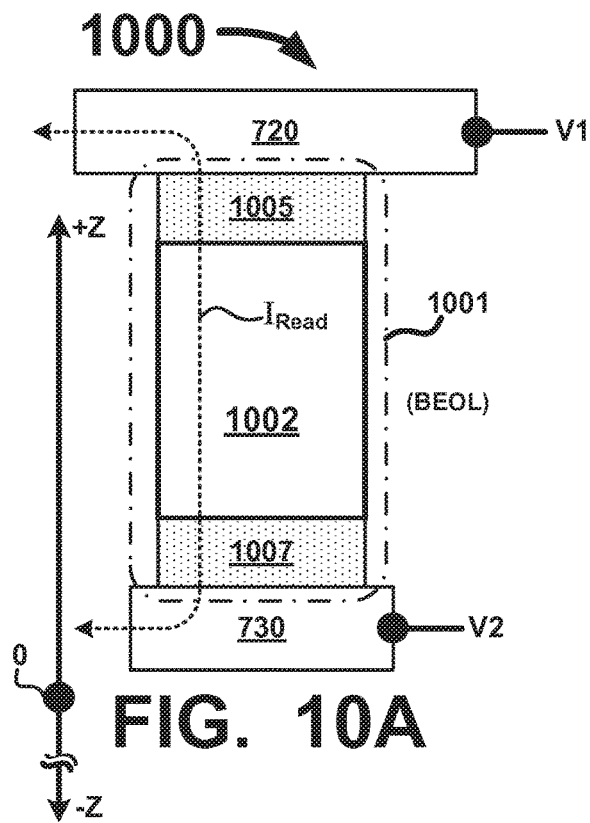
FIG. 10A is a cross-sectional view depicting a two-terminal memory element positioned between a cross-point of two conductive array lines, according to various embodiments.

FIG. 10A depicts a cross-sectional view of a configuration 1000 for a portion of a BEOL two-terminal cross-point memory array. Conductive array lines 720 and 730 are electrically coupled with FEOL driver circuitry (not shown) operative to apply voltage potentials V1 and V2 to the array lines 720 and 730 during data operations (e.g., read, write, program, erase, etc.). A two-terminal memory element 1002 is positioned between a cross-point 1001 of the array lines 720 and 730 and is electrically coupled with the array lines 720 and 730 via a first electrode 1005 (e.g., a top electrode—TE) and a second electrode 1007 (e.g., a bottom electrode—BE). The memory element 1002 is directly electrically in series with the array lines 720 and 730 when the memory element 1002 is discrete two-terminal memory element. On the other hand, if a selection device is included, then the selection device and the memory element 1002 are electrically in series with the array lines 720 and 730. When the applied voltage potentials V1 and V2 are a read voltage (e.g., during a read operation to the memory element 1002) the read current $\square_{READ}$ flows through the memory element 1002. The magnitude of the read current $\square_{READ}$ depends on the magnitude of the read voltage and the value of the resistive state stored in the memory element. As described above, the read current $\square_{READ}$ is sensed by circuitry (e.g., FEOL circuitry) to determine the value of data represented by the magnitude of the read current $\square_{READ}$.

Figure 10B:
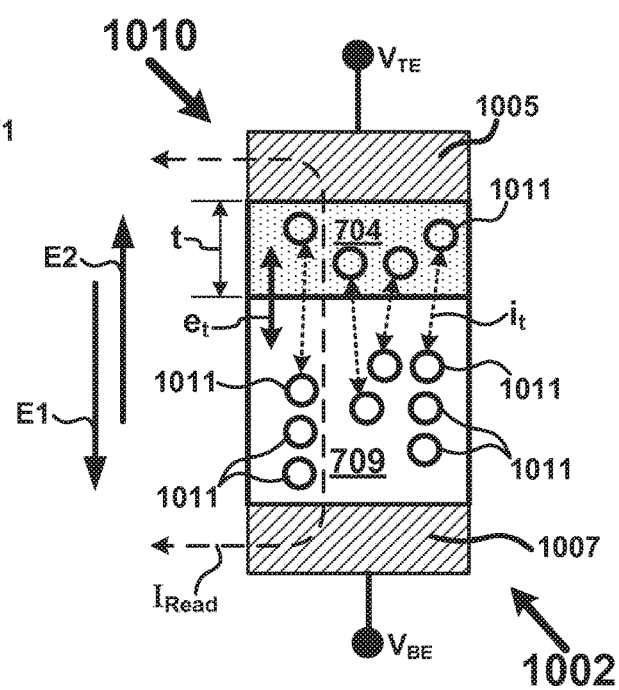
FIG. 10B is a cross-sectional view of a discrete re-writeable non-volatile two-terminal memory element including mobile oxygen ions, according to various embodiments.

Moving on to FIG. 10B, an exemplary discrete re-writable non-volatile two-terminal memory element 1002 includes at least one layer of a conductive metal oxide (CMO) 709 including mobile oxygen ions 1011. The CMO layer 709 is in direct contact with a layer of an insulating metal oxide (IMO) 704 having a having a substantially uniform thickness t that is approximately 50 Angstroms or less (e.g., in a range from about 5 Angstroms to about 35 Angstroms). The IMO 704 is an electrolyte to the mobile oxygen ions 1011 and has its thickness t selected to allow electron tunneling $e_t$ during data operations (e.g., read, write, program, erase, etc.) to the memory element 1002. Voltage potentials $V_{TE}$ and $V_{BE}$ are applied to the top and bottom electrodes 1005 and 1007 to effectuate data operations on the memory element 1002. During write operations to the memory element 1002, at least a portion of the mobile oxygen ions 1011 are transported $i_t$ from the CMO 709 to the IMO 704 or from the IMO 704 to the CMO 709. Application of write voltage potentials to the top and bottom electrodes 1005 and 1007 generates an electric field (E1 or E2) in the memory element 1002 with the direction of the electric field depending on the polarity of the write voltage potentials. Application of read voltage potentials to the top and bottom electrodes 1005 and 1007 generates read current $\square_{READ}$ that flows through the memory element 1002 while the read voltage potentials are applied. The magnitude of $\square_{READ}$ depends on the value of the resistive state stored in the memory element 1002 and on the magnitude of the read voltage potentials. Furthermore, the memory element 1002 can have the non-linear I-V characteristics described above in regards to FIG. 9 such that the discrete memory element 1002 includes integral selectivity due to its non-linear I-V characteristics. Therefore, the read current $\square_{READ}$ is a non-linear function of the read voltage applied across the top and bottom electrodes 1005 and 1007. Similarly, a current (not shown) that flows through the memory element 1002 during write operations will also be a non-linear function of the write voltage applied across the top and bottom electrodes 1005 and 1007.

Figure 10C:
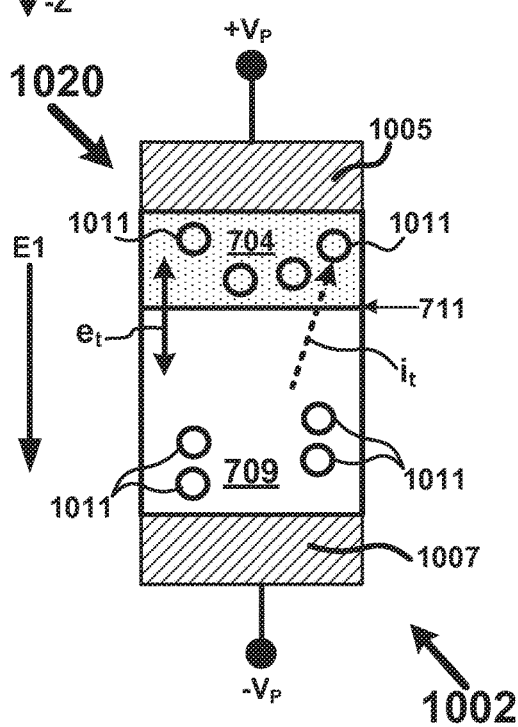
FIG. 10C is a cross-sectional view of mobile oxygen ion transport during a programming operation, according to various embodiments.

Configuration 1020 of FIG. 10C depicts a programming write operation to memory element 1002, where programming voltage potentials $+V_p$ and $-V_p$ are applied to top and bottom electrodes 1005 and 1007, respectively. Electric field E1 is generated and at least a portion of the negatively charged mobile ions 1011 are transported $i_t$ from the CMO layer 709 into the IMO layer 704. Here, the negatively charged mobile ions 1011 are transported $i_t$ across an interface 711 between layers 709 and 704 in a direction opposite that of the electric field E1. After the programming voltage potentials are removed, the transported mobile ions 1011 remain in the IMO layer 704 and a conductivity of the memory element 1002 is changed (e.g., is in a high resistance programmed state).

Figure 10D:
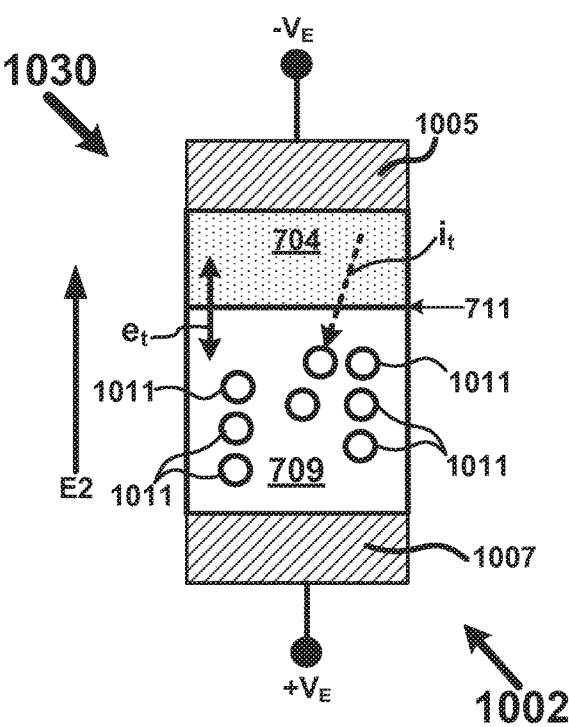
FIG. 10D is a cross-sectional view of mobile oxygen ion transport during an erase operation, according to various embodiments.

Configuration 1030 of FIG. 10D depicts an erase write operation to memory element 1002, where erase voltage potentials $+V_E$ and $-V_E$ are applied to top and bottom electrodes 1005 and 1007, respectively. Electric field E2 is generated and at least a portion of the negatively charged mobile ions 1011 are transported $i_t$ from the IMO layer 704 into the CMO layer 709. Here, the negatively charged mobile ions 1011 are transported $i_t$ across the interface 711 between layers 709 and 704 in a direction opposite that of the electric field E2. After the erase voltage potentials are removed, the transported mobile ions 1011 remain in the CMO layer 709 and a conductivity of the memory element 1002 is changed (e.g., is in a low resistance erased state).

Although the foregoing discussion with regards to FIGS. 10B-10D describes one type of non-volatile two-terminal memory element, the present application is not limited to the configurations depicted in FIGS. 10B-10D. Other types of memory elements including but not limited to filamentary resistive random access memory (RRAM), conductive bridge RRAM also known as CBRAM, phase change RRAM, ferroelectric RAM (FeRAM), molecular RRAM, Memristor RRAM, interfacial RRAM, carbon nanotube RRAM, spin-torque MRAM (STT-MRAM), just to name a few. Further, those other types of memory elements can be implemented as discrete memory elements (e.g., as in FIG. 8A) or can include a selection device as described above (e.g., such as the types described in FIGS. 8C-8G).

In various embodiments, in regards to the layers 704 and 709 of FIG. 10B, the layer 709 can include one or more layers of a conductive oxide material, such as one or more layers of a conductive metal oxide-based ("CMO-based") material, for example. The CMO material is selected for it properties as a variable resistive material that includes mobile oxygen ions and is not selected based on any ferroelectric properties, piezoelectric properties, magnetic properties, superconductive properties, or for any mobile metal ion properties. In various embodiments, layer 709 can include but is not limited to a manganite material, a perovskite material selected from one or more the following: $PrCaMnO_X$ (PCMO), $LaNiO_X$ (LNO), $SrRuO_X$ (SRO), $LaSrCrO_X$ (LSCrO), $LaCaMnO_X$ (LCMO), $LaSrCaMnO_X$ (LSCMO), $LaSrMnO_X$ (LSMO), $LaSrCoO_X$ (LSCoO), and $LaSrFeO_X$ (LSFeO), where x is nominally 3 for perovskites (e.g., x≤3 for perovskites) or structure 269 can be a conductive binary oxide structure comprised of a binary metal oxide having the form $A_XO_Y$, where A represents a metal and O represents oxygen. The conductive binary oxide material may be doped (e.g., with niobium—Nb, fluorine—F, and nitrogen—N) to obtain the desired conductive properties for a CMO. In various embodiments, layer 704 can include but is not limited to a material for implementing a tunnel barrier layer and is an electrolyte that is permeable to the mobile oxygen ions at voltages for write operations. Suitable materials for the layer 704 including but not limited to one or more of the following: high-k dielectric materials, rare earth oxides, rare earth metal oxides, yttria-stabilized zirconium (YSZ), zirconia ($ZrO_X$), yttrium oxide ($YO_X$), erbium oxide ($ErO_X$), gadolinium oxide ($GdO_X$), lanthanum aluminum oxide ($LaAlO_X$), hafnium oxide ($HfO_X$), aluminum oxide (AlOx), silicon oxide (SiOx), and equivalent materials. Typically, the layer 704 comprises a thin film layer having a substantially uniform thickness of approximately less than 50 Angstroms (e.g., in a range from about 5 Angstroms to about 35 Angstroms).

In regards to FIGS. 10B-10C, the memory element 1002 used individually or when a plurality of the memory elements 1002 are disposed in a cross-point array (e.g., array 710 in FIG. 7B), does not require an erase operation prior to a write operation and does not require a block erase operation prior to a write operation (e.g., to a block of memory). Furthermore, data operations on memory that includes the memory element(s) 1002 does not require a Flash operating system (Flash OS) and data can be randomly written or read at a granularity of a single bit (e.g., a single memory element 1002 can be read or written) or higher (e.g., in nibbles, bytes, pages, blocks, etc.). The memory element 1002 used individually or when a plurality of the memory elements 1002 are disposed in a cross-point array (e.g., array 710 in FIG. 7B) can be used to emulate and replace other memory types including but not limited to Flash memory (e.g., NAND Flash and/or NOR Flash), DRAM, SRAM, EEPROM, ROM, OTP, just to name a few.

Figure 11:
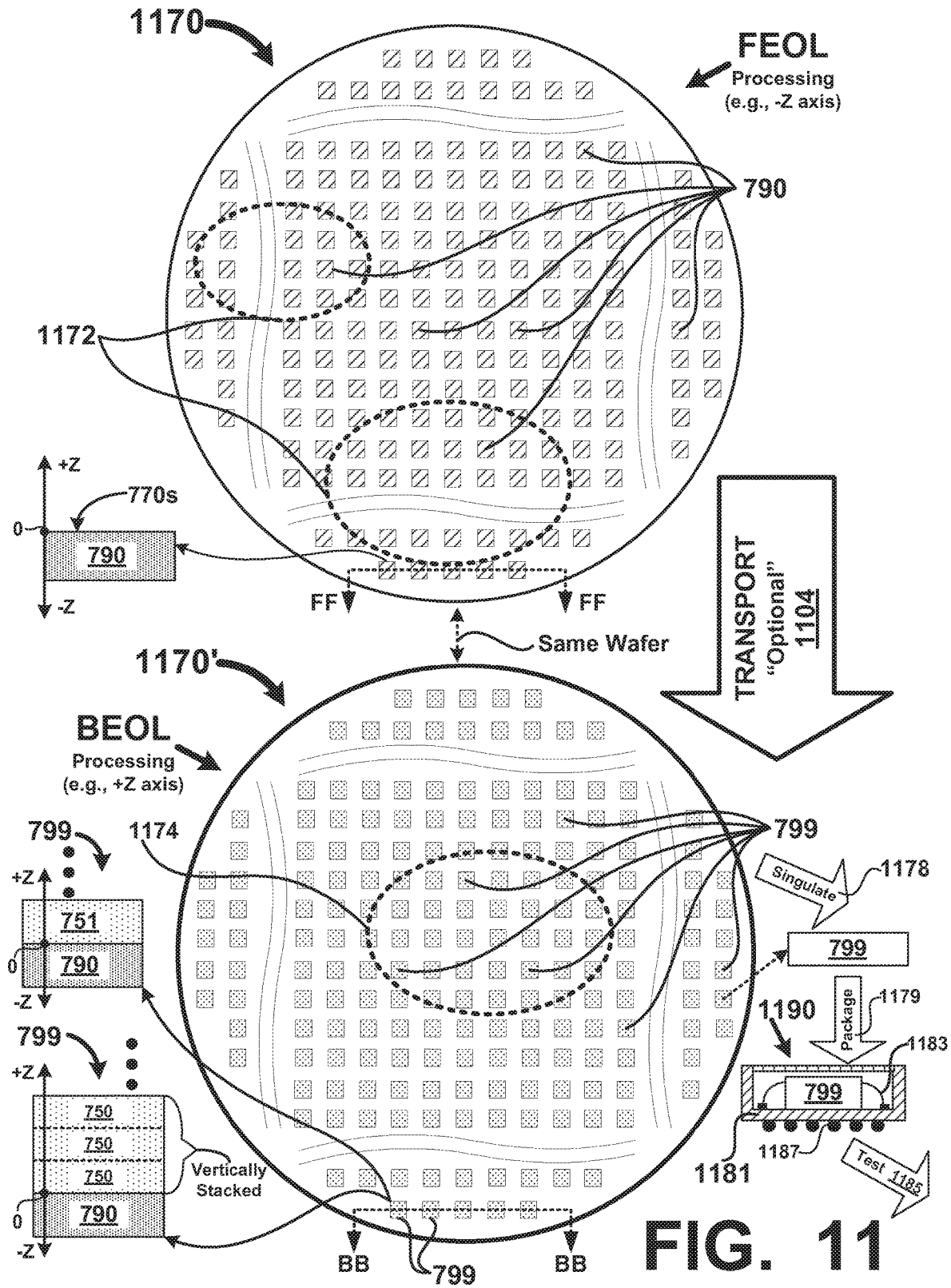
FIG. 11 depicts top plan views of a wafer processed FEOL to form a plurality of base layer die including active circuitry and the same wafer subsequently processed BEOL to integrally form one or more layers of memory directly on top of the base layer die where the finished die can subsequently be singulated, tested, and packaged into integrated circuits.

FIG. 11 is a top plan view depicting a single wafer (denoted as 1170 and 1170') at two different stages of fabrication on the same wafer: FEOL processing on the wafer denoted as 1170 during the FEOL stage of processing where active circuitry (e.g., CMOS circuitry) in logic layer 770 is fabricated on the substrate that comprises base layer die 790 (e.g., a silicon wafer); followed by BEOL processing on the same wafer denoted as 1170' during the BEOL stage of processing where one or more layers (e.g., 751 or 750) of BEOL non-volatile memory are fabricated directly on top of the FEOL logic layer 770 (e.g., an on upper surface 770s of the FEOL interlayer interconnect structure). Wafer 1170 includes a pluralities of the base layer die 790 (see 790 in FIG. 7F) formed individually on wafer 1170 as part of the FEOL process. As part of the FEOL processing, the base layer die 790 may be tested 1172 to determine their electrical characteristics, functionality, performance grading, etc. After all FEOL processes have been completed, the wafer 1170 is optionally transported 1104 for subsequent BEOL processing (e.g., adding one or more layers of memory such as single layer 751 or multiple layers 750) directly on top of each base layer die 790. A base layer die 790 is depicted in cross-sectional view along a dashed line FF-FF where a substrate (e.g., a silicon Si wafer) for the die 790 and its associated active circuitry in logic layer 770 have been previously FEOL fabricated and are positioned along the −Z axis. For example, the one or more layers of memory (e.g., 751 or 750) are grown directly on top of an upper surface 770s of each base layer die 790 as part of the subsequent BEOL processing. Upper layer 770s can be an upper planar surface of the aforementioned interlayer interconnect structure operative as a foundation for subsequent BEOL fabrication of the memory layers along the +Z axis.

During BEOL processing the wafer 1170 is denoted as wafer 1170', which is the same wafer subjected to additional processing to fabricate the memory layer(s) and their associated memory elements directly on top of the base layer die 790. Base layer die 790 that failed testing may be identified either visually (e.g., by marking) or electronically (e.g., in a file, database, email, etc.) and communicated to the BEOL fabricator and/or fabrication facility. Similarly, performance graded base layer die 790 (e.g., graded as to frequency of operation) may identified and communicated to BEOL the fabricator and/or fabrication facility. In some applications the FEOL and BEOL processing can be implemented by the same fabricator or performed at the same fabrication facility. Accordingly, the transport 1104 may not be necessary and the wafer 1170 can continue to be processed as the wafer 1170'. The BEOL process forms the aforementioned memory elements and memory layer(s) directly on top of the base layer die 790 to form a finished die 799 (see above reference to die 799 in regards to FIG. 7F) that includes the FEOL circuitry portion 770 along the −Z axis and the BEOL memory portion along the +Z axis. A cross-sectional view along a dashed line BB-BB depicts a memory device die 799 with a single layer of memory 751 grown (e.g., fabricated) directly on top of base die 790 along the +Z axis, and alternatively, another memory device die 799 with three vertically stacked layers of memory 750 grown (e.g., fabricated) directly on top of base die 790 along the +Z. Finished die 799 on wafer 1170' may be tested 1174 and good and/or bad die identified. Subsequently, the wafer 1170' can be singulated 1178 to remove die 799 (e.g., die 799 are precision cut or sawed from wafer 1170') to form individual memory device die 799. The singulated die 799 may subsequently be packaged 1179 to form integrated circuit chip 1190 for mounting to a PC board or the like, as a component in an electrical system (not shown) that electrically accesses IC 1190 to perform data operations on BEOL memory. Here a package 1181 can include an interconnect structure 1187 (e.g., pins, solder balls, or solder bumps) and the die 799 mounted in the package 1181 and electrically coupled 1183 with the interconnect structure 1187 (e.g., using wire bonding). The integrated circuits 1190 (IC 1190 hereinafter) may undergo additional testing 1185 to ensure functionality and yield. The die 799 or the IC 1190 can be used in any system requiring non-volatile memory and can be used to emulate a variety of memory types including but not limited to SRAM, DRAM, and FLASH. Unlike conventional FLASH non-volatile memory, the die 799 and/or the IC's 1190 do not require an erase operation or a block erase operation prior to a write operation so the latency associated with conventional Flash memory erase operations is eliminated and the latency associated with FLASH OS and/or FLASH file system required for managing the erase operation is eliminated. Moreover, a battery back-up power source or other AC or DC power source is not required to retain data stored in the memory elements embedded in each memory layer (751 or 750) because the memory is non-volatile and retains stored data in the absence of electrical power. Another application for the IC's 1190 is as a replacement for conventional FLASH-based non-volatile memory in embedded memory, solid state drives (SSD's), hard disc drives (HDD's), or cache memory, for example.

Although the foregoing description and examples have been in reference to write operations and the application of write voltages as one example of a data operation, the present invention is not limited to write operations and the foregoing description and examples are applicable to other types of data operations such as a read operation, for example. Therefore, the access signal generator, tracking signal generator, line drivers, line characteristic adjuster and other FEOL circuitry described herein can be configured to operate for a variety of data operations including but not limited to read operation, write operations, program operations, erase operations, just to name a few. For example, in FIGS. 1A-1B, 2B, 2C, 3, 4B, 5A-5D, 6B-6C, 7A-7F, 8A-8B, 9, and 10A-10B, the tracking voltage signal and related circuitry can be configured to track and compensate for a magnitude of a read voltage signal instead of a write voltage signal when the data operation to the array and its associated slices is a read operation. The monitoring signal(s) from the line monitor(s) can be generated by signals from the indicator memory element(s) that are consistent with read operations to the slice(s) (e.g., the magnitude of read voltages is typically lower than the magnitude of write voltages). Therefore, the FEOL circuitry described herein can be operative to regulate voltages for selected and un-selected memory elements for any type of data operation to memory such as read operations, write operations, or both. Furthermore, some data operations to the array can be characterized as a restore operation operative to apply a restore voltage across a memory element(s) to adjust upward or downward the resistive state of the memory element(s) to compensate for prior disturbs to the memory element(s) caused by prior data operations. The restore voltage may be applied in one or several voltage pulses to bump up and/or bump down the resistive state until the correct (e.g., nominal) resistive state is obtained. For example, a memory element storing data in the programmed state (e.g., a nominal resistance of $\approx 1\Omega$) can have the nominal resistance value associated with the programmed state disturbed, either upward (i.e., an increased resistance value) or downward (i.e., a decreased resistance value). A restore data operation to the memory element is configured to apply appropriate restore voltages across the disturbed memory element so that the current resistive state of the memory element (e.g., the disturbed or corrupted resistive state) is corrected back the nominal resistance value associated with the programmed state. Accordingly, the FEOL circuitry described herein can be operative to regulate voltages for restore operations as a type of data operation to memory. Restore operations are applicable to SLC and MLC memory elements.

In at least some of the embodiments of the invention, the structures and/or functions of one or more of the above-described features and/or elements can be implemented in software, hardware, firmware, circuitry, or a combination thereof. Note that the structures and constituent elements shown in the figures, as well as their functionality, can be aggregated with one or more other structures or elements. Alternatively, the elements and their functionality can be subdivided into constituent sub-elements, if any.

The various embodiments of the invention can be implemented in numerous ways, including as a system, a process, an apparatus, or a series of program instructions on a non-transitory computer readable medium such as a computer readable storage medium or a computer network where the program instructions are sent over optical or electronic communication links. In general, the steps of disclosed processes can be performed in an arbitrary order, unless otherwise provided in the claims.

The foregoing description, for purposes of explanation, uses specific nomenclature to provide a thorough understanding of the invention. However, it will be apparent to one skilled in the art that specific details are not required in order to practice the invention. In fact, this description should not be read to limit any feature or aspect of the present invention to any embodiment; rather features and aspects of one embodiment can readily be interchanged with other embodiments. Notably, not every benefit described herein need be realized by each embodiment of the present invention; rather any specific embodiment can provide one or more of the advantages discussed above. In the claims, elements and/or operations do not imply any particular order of operation, unless explicitly stated in the claims. It is intended that the following claims and their equivalents define the scope of the invention.

What is claimed is:

1. A memory device, comprising:
an array of re-writable non-volatile two-terminal resistive memory elements, each being disposed between a word line and a bit line; and
a tracking signal generator configured to track a value of an access signal, the access signal to perform a data operation on a first set of elements of the array and apply a tracking signal to a second set of elements of the array, the tracking signal having a magnitude that tracks a magnitude of the access signal by a differential amount.

2. The memory device of claim 1, further comprising:
an access signal generator configured to receive a signal to perform the data operation on the first set of elements of the array disposed between a first word line and a first set of bit lines and to modify a magnitude of the signal to generate the access signal to perform the data operation on the first set of elements; and
a line monitor electrically coupled with the first word line and configured to sample the access signal, and to generate a monitoring signal responsive to the sampled access signal.

3. The memory device of claim 1, wherein the differential amount is applied across a first terminal and a second terminal of each of the second set of elements to maintain a non-writeable state.

4. The memory device of claim 1, wherein the second set of elements are disposed between a second word line and a second set of bit lines, wherein the tracking signal generator is configured to apply the tracking signal via the second word line to set the second set of bit lines to the magnitude of the tracking signal.

5. The memory device of claim 1, further comprising:
a bit line driver configured to modify the differential amount to place the first set of elements in a writeable state,
wherein the magnitude of the tracking signal for the second set of elements is a position-dependent magnitude based on the access signal applied to the first set of elements.

6. The memory device of claim 2 wherein:
the access signal generator is configured to adjust the magnitude of the signal as a function of a voltage difference between the voltage at positions of the first set of elements and the voltage at the access signal generator; and
the tracking signal generator is configured to adjust the magnitude of the tracking signal to substantially maintain the differential amount.

7. The memory device of claim 2 wherein the line monitor is arranged to provide a corresponding monitoring signal for each one of the first set of bit lines.

8. The memory device of claim 2, wherein the tracking signal generator comprises a ratio circuit to change the monitoring signal to form a changed monitoring signal, and the changed monitoring signal is electrically coupled with a unity gain amplifier circuit configured to generate the tracking signal based on the changed monitoring signal.

9. The memory device of claim 2, further comprising:
an indicator bit line; and
a discrete non-volatile two-terminal indicator resistive memory element electrically coupled with the indicator bit line and one word line and operative to generate a monitoring signal representing a detected magnitude for the signal at or near an end of the first word line opposite to the other end that is electrically coupled with the access signal generator.

10. The memory device of claim 2, further comprising:
another discrete re-writeable non-volatile two-terminal resistive memory element electrically coupled with the one word line and to another bit line, wherein the access signal generator is configured to adjust the magnitude of the signal to compensate for a voltage drop associated with the other discrete rewriteable non-volatile two-terminal resistive memory element.

11. The memory device of claim 2, wherein the access signal generator is configured to adjust the magnitude of the signal to compensate for a deviation in the magnitude from a target magnitude.

12. The memory device of claim 2, wherein the access signal generator is further configured to modify the magnitude of the signal to form an erase voltage magnitude as the modified magnitude.

13. The memory device of claim 2, wherein the access signal generator is further configured to modify the magnitude of the signal to form a program voltage magnitude as the modified magnitude.

14. The memory device of claim 2, further comprising:
a slice-rolling controller configured to generate the modified magnitude for transmission to an end of the word line and to an end of another word line, the end of the word line and the end of the other word line are substantially equidistant from the access signal generator;
a first line monitor disposed at the end of the word line; and
a second line monitor disposed at the end of the other word line,
wherein the tracking signal generator is configured to apply the tracking signal to a first set of bit lines associated with the word line and to a second set of bits lines associated with the other word line.

15. The memory device of claim 14, wherein the slice-rolling controller is configured further to increase the magnitude of the tracking signal as a distance increases along the end of the word line and the end of the other word line relative to the access signal generator.

16. A method comprising:
receiving an access signal to perform a data operation on a first set of elements of an array of re-writeable non-volatile two-terminal resistive memory elements, each being disposed between a word line and a bit line;
tracking a value of the access signal; and
applying a tracking signal to a second set of elements of the array, the tracking signal having a magnitude that tracks a magnitude of the access signal by a differential amount.

17. The method of claim 16, further comprising:
receiving a signal to perform the data operation on the first set of elements of the array disposed between a first word line and a first set of bit lines;
generating the access signal by modifying a magnitude of the signal, the access signal having a modified magnitude from the signal; and sampling the access signal; and generating a monitoring signal responsive to the sampled magnitude of the access signal.

18. The method of claim 17, further comprising:

modifying the differential amount to place the first set of elements in a writeable state, wherein the magnitude of the tracking signal for the second set of elements is a position-dependent magnitude based on the modified magnitude applied to the first set of elements.

19. A non-transitory computer-readable medium having information stored therein for operating a memory device having an array of two-terminal memory elements, wherein the stored information operates the memory device so as to:

receive an access signal to perform a data operation on a first set of elements of the array;

track a value of the access signal; and apply a tracking signal to a second set of elements of the array, the tracking signal having a magnitude that tracks a magnitude of the access signal by a differential amount.

20. The non-transitory computer-readable medium of claim 19, wherein the stored information further operates the memory device to:

receive a signal to perform the data operation on the first set of elements of the array disposed between a first word line and a first set of bit lines;

generate the access signal by modifying a magnitude of the signal, the access signal having a modified magnitude from the signal; and sample the modified magnitude of the access signal; and generate a monitoring signal responsive to the sampled magnitude of the access signal.

* * * * *